(12) United States Patent
Kim et al.

(10) Patent No.: US 11,227,531 B2
(45) Date of Patent: *Jan. 18, 2022

(54) DISPLAY DEVICE

(71) Applicant: Samsung Display Co., Ltd., Yongin-Si (KR)

(72) Inventors: Yang Wan Kim, Yongin-si (KR); Su Jin Lee, Yongin-si (KR); Sun Ja Kwon, Yongin-si (KR); Byung Sun Kim, Yongin-si (KR); Hyun Ae Park, Yongin-si (KR); Hyung Jun Park, Yongin-si (KR); Jae Yong Lee, Yongin-si (KR); Yu Jin Jeon, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 16/995,615

(22) Filed: Aug. 17, 2020

(65) Prior Publication Data

US 2020/0380908 A1    Dec. 3, 2020

Related U.S. Application Data

(63) Continuation of application No. 16/557,977, filed on Aug. 30, 2019, now Pat. No. 10,748,472, which is a
(Continued)

(30) Foreign Application Priority Data

Sep. 22, 2016    (KR) ........................ 10-2016-0121559

(51) Int. Cl.
*G09G 3/20*    (2006.01)
*G09G 3/22*    (2006.01)
(Continued)

(52) U.S. Cl.
CPC ............. *G09G 3/2092* (2013.01); *G09G 3/22* (2013.01); *G09G 3/3233* (2013.01);
(Continued)

(58) Field of Classification Search
CPC ......... G09G 2300/0426; G09G 3/3225; G09G 3/3275; G09G 2310/0267; G09G 3/20; G09G 3/3648
See application file for complete search history.

(56) References Cited

U.S. PATENT DOCUMENTS

| 6,774,414 B2 | 8/2004 | Chang |
| 7,253,865 B2 | 8/2007 | Battersby |

(Continued)

FOREIGN PATENT DOCUMENTS

| CN | 1628263 A | 6/2005 |
| CN | 1656530 A | 8/2005 |

(Continued)

OTHER PUBLICATIONS

Notice of Allowance in connection with U.S. Appl. No. 16/298,924 dated Apr. 14, 2021 19 pages.

(Continued)

*Primary Examiner* — Gerald Johnson
(74) *Attorney, Agent, or Firm* — Innovation Counsel LLP

(57) ABSTRACT

A display device includes: a substrate including a first pixel area, a second pixel area having a smaller area than the first pixel area and connected to the first pixel area, and a peripheral area surrounding the first pixel area and the second pixel area; a first pixel provided in the first pixel area and a second pixel provided in the second pixel area; a first line connected to the first pixel and a second line connected to the second pixel; a dummy part disposed in the peripheral area, overlapping at least one of the first line and the second line and providing a parasitic capacitance that compensates
(Continued)

for a difference in a load value between the first line and the second line; and a power supply line provided in the first and second pixel areas. The dummy part includes an insulating layer having at least one contact hole.

17 Claims, 17 Drawing Sheets

Related U.S. Application Data continuation of application No. 15/709,196, filed on Sep. 19, 2017, now Pat. No. 10,403,193.

(51) Int. Cl.
*H01L 27/32* (2006.01)
*G09G 3/3233* (2016.01)

(52) U.S. Cl.
CPC ...... *H01L 27/3223* (2013.01); *H01L 27/3279* (2013.01); *G09G 2300/0408* (2013.01); *G09G 2300/0413* (2013.01); *G09G 2300/0426* (2013.01); *G09G 2300/0439* (2013.01); *G09G 2300/08* (2013.01); *G09G 2300/0814* (2013.01); *G09G 2300/0842* (2013.01); *G09G 2300/0861* (2013.01); *G09G 2300/0866* (2013.01); *G09G 2310/0232* (2013.01); *G09G 2310/0251* (2013.01); *G09G 2310/0262* (2013.01); *G09G 2310/0267* (2013.01); *G09G 2320/0223* (2013.01)

(56) References Cited

U.S. PATENT DOCUMENTS

| | | | |
|---|---|---|---|
| 7,579,624 B2 | 8/2009 | Takasugi et al. | |
| 7,911,423 B2 | 3/2011 | Kim et al. | |
| 8,089,596 B2 | 1/2012 | Koma et al. | |
| 8,325,116 B2 | 12/2012 | Takasugi et al. | |
| 8,350,972 B2 | 1/2013 | Taneda et al. | |
| 8,477,250 B2 | 7/2013 | Schellingerhout et al. | |
| 8,665,249 B2 | 3/2014 | Suh | |
| 8,736,525 B2 | 5/2014 | Kawabe | |
| 9,305,508 B2 | 4/2016 | Park et al. | |
| 9,716,132 B2 | 7/2017 | Kinoshita | |
| 9,837,022 B2 | 12/2017 | Lee et al. | |
| 10,115,780 B2 | 10/2018 | Kim et al. | |
| 10,229,964 B2 | 3/2019 | Kim et al. | |
| 10,354,578 B2 | 7/2019 | Ka et al. | |
| 10,418,597 B2 | 9/2019 | Li et al. | |
| 10,467,958 B2 | 11/2019 | Kim et al. | |
| 10,490,119 B2 | 11/2019 | Kim et al. | |
| 10,490,122 B2 | 11/2019 | Kim et al. | |
| 10,504,446 B2 | 12/2019 | Kim et al. | |
| 10,516,016 B2 | 12/2019 | Kim et al. | |
| 10,636,859 B2 | 4/2020 | Park et al. | |
| 2003/0030630 A1 | 2/2003 | Bayot et al. | |
| 2004/0012744 A1 | 1/2004 | Ishige et al. | |
| 2004/0125258 A1 | 7/2004 | Moon et al. | |
| 2005/0243259 A1* | 11/2005 | Song | G02F 1/1393 349/143 |
| 2006/0244387 A1 | 11/2006 | Park et al. | |
| 2006/0290618 A1 | 12/2006 | Goto | |
| 2007/0080433 A1 | 4/2007 | Lai | |
| 2008/0088568 A1 | 4/2008 | Haga et al. | |
| 2008/0218450 A1 | 9/2008 | Park | |
| 2009/0102758 A1 | 4/2009 | Anzai et al. | |
| 2009/0102824 A1 | 4/2009 | Tanaka et al. | |
| 2009/0295843 A1 | 12/2009 | Dunn | |
| 2009/0303260 A1 | 12/2009 | Takasugi | |
| 2009/0303404 A1 | 12/2009 | Kretz | |
| 2010/0020059 A1 | 1/2010 | Suh | |
| 2010/0039604 A1 | 2/2010 | Kim | |
| 2010/0073335 A1 | 3/2010 | Min et al. | |
| 2010/0177024 A1 | 7/2010 | Choi | |
| 2010/0187533 A1 | 7/2010 | Chang | |
| 2011/0084955 A1 | 4/2011 | Kim | |
| 2012/0112988 A1 | 5/2012 | Nakanish et al. | |
| 2013/0106817 A1 | 5/2013 | Gang et al. | |
| 2015/0022513 A1 | 1/2015 | Kim | |
| 2015/0069348 A1* | 3/2015 | Tae | H01L 27/3262 257/40 |
| 2015/0325593 A1 | 11/2015 | Shih et al. | |
| 2015/0331290 A1 | 11/2015 | Jung et al. | |
| 2015/0379930 A1 | 12/2015 | Lee et al. | |
| 2016/0012768 A1 | 1/2016 | In et al. | |
| 2016/0019856 A1 | 1/2016 | Tanaka et al. | |
| 2016/0027380 A1 | 1/2016 | Kim et al. | |
| 2016/0035811 A1 | 2/2016 | Choi et al. | |
| 2016/0086977 A1 | 3/2016 | Go et al. | |
| 2016/0111040 A1 | 4/2016 | Kim et al. | |
| 2016/0190166 A1 | 6/2016 | Kim et al. | |
| 2016/0240141 A1 | 8/2016 | Lee et al. | |
| 2016/0321992 A1 | 11/2016 | Kim et al. | |
| 2017/0249896 A1 | 8/2017 | Kim et al. | |
| 2017/0301280 A1 | 10/2017 | Ka et al. | |
| 2018/0005585 A1 | 1/2018 | Kim et al. | |
| 2018/0075804 A1 | 3/2018 | Kim et al. | |
| 2018/0090061 A1 | 3/2018 | Kim et al. | |
| 2018/0151660 A1 | 5/2018 | Kim et al. | |
| 2018/0151663 A1 | 5/2018 | Kim et al. | |
| 2018/0240856 A1 | 8/2018 | Kim et al. | |
| 2019/0035876 A1 | 3/2019 | Kim et al. | |
| 2020/0090584 A1 | 3/2020 | Kim et al. | |
| 2020/0098310 A1 | 3/2020 | Kim et al. | |

FOREIGN PATENT DOCUMENTS

| | | |
|---|---|---|
| CN | 1836269 A | 9/2006 |
| CN | 101401143 A | 4/2009 |
| CN | 101443695 A | 5/2009 |
| CN | 101561992 A | 10/2009 |
| CN | 101578649 A | 11/2009 |
| CN | 101313349 A | 12/2010 |
| CN | 102396020 A | 3/2012 |
| CN | 102789755 A | 11/2012 |
| CN | 202583659 U | 12/2012 |
| CN | 103579221 A | 2/2014 |
| CN | 104077998 A | 10/2014 |
| CN | 105204248 A | 12/2015 |
| CN | 106711180 A | 5/2017 |
| EP | 1063630 A2 | 12/2000 |
| EP | 2085952 A1 | 8/2009 |
| EP | 3232431 A1 | 10/2017 |
| EP | 3264405 A2 | 1/2018 |
| JP | 2007-232981 A | 9/2007 |
| KR | 10-0672792 B1 | 1/2007 |
| KR | 10-2008-0060886 A | 7/2008 |
| KR | 10-2009-0005651 A | 1/2009 |
| KR | 10-1054327 B1 | 8/2011 |
| KR | 10-1064425 B1 | 9/2011 |
| KR | 10-1101070 B1 | 12/2011 |
| KR | 10-1376654 B1 | 3/2014 |
| KR | 10-1416529 B1 | 7/2014 |
| KR | 10-1432126 B1 | 8/2014 |
| KR | 10-2016-0099770 A | 8/2016 |
| KR | 10-2017-0102147 A | 9/2017 |
| KR | 10-2017-0119270 A | 10/2017 |
| KR | 10-2018-0003747 A | 1/2018 |
| KR | 10-2018-0029133 A | 3/2018 |
| KR | 10-2018-0033373 A | 4/2018 |
| KR | 10-2018-0061565 A | 6/2018 |
| TW | 201109786 A | 3/2011 |
| WO | 2007/069187 A2 | 6/2007 |

OTHER PUBLICATIONS

Notice of Allowance in connection with U.S. Appl. No. 16/805,635 dated Feb. 28, 2020 10 pages.

Zhou Lei et al., "Design Analysis of Large Size Metal Oxide TFT Panel," Chinese Journal of Luminescence, vol. 36, No. 5, May 2015, pp. 577-582.

(56) References Cited

OTHER PUBLICATIONS

Uchida Yoshihiro et al., "Parasitic capacitance modeling for TFT liquid crystal displays," ESSDERC 03. 33rd Conference on European Solid-State Device Research, Oct. 2004, pp. 453-456.
Chinese Communication corresponding to Chinese Patent Application No. 201710515778 dated Oct. 9, 2020 11 pages.
Extended European Search Report corresponding to EP Application No. 17192326.1, dated Jan. 22, 2018, 11 pages.
Extended European Search Report, Application No. 21164738.3 dated Jun. 14, 2021, 12 pages.

* cited by examiner

DISPLAY DEVICE

CROSS-REFERENCE TO RELATED APPLICATION

This application is a continuation application of U.S. patent application Ser. No. 16/557,977 filed on Aug. 30, 2019, which is a continuation application of U.S. patent application Ser. No. 15/709,196 filed on Sep. 19, 2017, now issued to U.S. Pat. No. 10,403,193, which claims priority to, and the benefit of, Korean Patent Application No. 10-2016-0121559 filed on Sep. 22, 2016 in the Korean Intellectual Property Office, the disclosures of which are incorporated herein by reference in their entirety.

BACKGROUND

1. Field

The present disclosure relates to a display device.

2. Description of the Related Art

A display device may include a plurality of pixels, and each of the pixels includes a display element. Each of the pixels may further include lines and a plurality of transistors that are connected to the lines and drive the display element.

The lines that are connected to the pixels may have varying load values depending on their lengths. The size of a pixel area where the pixels are disposed may vary depending on the position thereof due to a process margin. A brightness difference caused by the difference in the load values between the lines and a difference in size of the pixel area may occur in an image displayed on the display device.

SUMMARY

Embodiments of the present disclosure provide a display device having uniform brightness.

Embodiments of the present disclosure provide a display device, including a substrate including a first pixel area, a second pixel area having a smaller area than the first pixel area and connected to the first pixel area, and a peripheral area surrounding the first pixel area and the second pixel area, a first pixel provided in the first pixel area and a second pixel provided in the second pixel area, a first line connected to the first pixel and a second line connected to the second pixel, a dummy part disposed in the peripheral area, overlapping with at least one of the first line and the second line, and providing a parasitic capacitance that compensates for a difference in a load value between the first line and the second line; and a power supply line provided in the first pixel area and the second pixel area, wherein the dummy part includes an insulating layer having at least one contact hole.

The dummy part may include an active pattern provided on the substrate; and a first metal layer provided on the insulating layer, wherein the insulating layer is provided on the active pattern and a portion of the active pattern is exposed through the at least one contact hole, and wherein the active pattern and the first metal layer are connected through the contact hole.

The contact hole may be provided in an overlapping area between the active pattern and the first metal layer.

The first metal layer may be connected to the power supply line.

A fixed voltage may be applied to the power supply line and the dummy part.

The peripheral area may include a first peripheral area in a vicinity of the first pixel area; a second peripheral area in a vicinity of the second pixel area; and an additional peripheral area adjacent to the first pixel area and the second peripheral area.

The dummy part may be disposed in the second peripheral area.

The dummy part may further include a second metal layer disposed between the active pattern and the first metal layer.

The insulating layer may further include a dummy contact hole.

A density of elements disposed in the dummy part may be similar to a density of elements disposed in the second pixel that is disposed closest to the dummy part in the second pixel area.

The dummy part may include at least two sub-dummy parts separated from each other in a distance.

The at least two sub-dummy parts may be connected to each other by a coupling pattern.

The coupling pattern may be provided between the second metal layer and the first metal layer.

The display device may further include a passivation layer provided on the first metal layer, a pixel defining layer provided on the passivation layer, and a sealing layer covering portions of the first pixel area, the second pixel area, and the peripheral area and including an inorganic material.

The passivation layer and the pixel defining layer may include a valley formed by removing portions of the passivation layer and the pixel defining layer along circumferences of the first pixel area and the second pixel area.

The valley may be formed at a position corresponding to the coupling pattern.

The sealing layer may cover side surfaces of the passivation layer and the pixel defining layer.

The first line may be a first scan line extending in a first direction on the substrate and supplying a scan signal to the first pixel, and the second line may be a second scan line extending in the first direction and supplying a scan signal to the second pixel.

A length of the first scan line may be greater than a length of the second scan line.

The second scan line may extend to the second peripheral area and overlaps with the dummy part.

The second scan line extending to the second peripheral area may be formed integrally with the second metal layer.

The display device may further include a first emission control line connected to the first pixel and a second emission control line connected to the second pixel.

The second emission control line may extend to the second peripheral area and overlaps with the dummy part.

The display device may further include a data line extending in a second direction that crosses the first direction on the substrate, wherein the data line is separated from the power supply line.

The second pixel may include a transistor connected to the second scan line and the data line, and wherein the transistor includes: the active pattern provided on the substrate, a gate electrode provided on the active pattern with a gate insulating layer interposed therebetween, an interlayer insulating layer including a first interlayer insulating layer covering the gate electrode and a second interlayer insulating layer disposed on the first interlayer insulating layer, and a source electrode and a drain electrode disposed on the interlayer insulating layer and connected to the active pattern.

The substrate may further include a third area separated from the second pixel area and connected to the first pixel area and a third peripheral area surrounding the third pixel area.

The dummy part may be disposed in the third peripheral area.

The display device may further include a third pixel provided in the third pixel area, and a third scan line supplying a scan signal to the third pixel, wherein the third scan line extends to the third peripheral area and overlaps with the dummy part.

DETAILED DESCRIPTION

Figure 1:
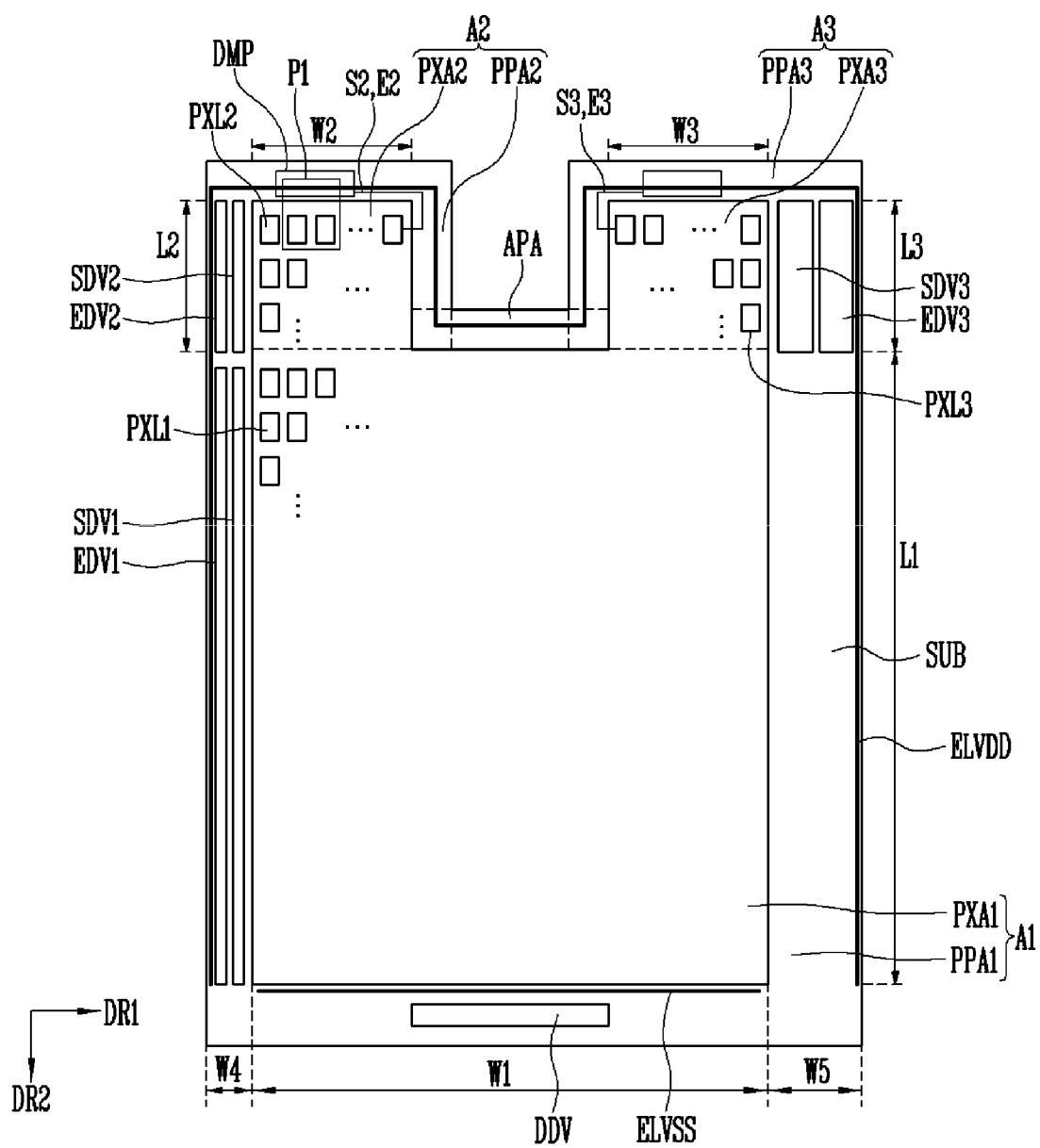
FIGS. 1 and 2 are plan views illustrating a display device, according to various embodiments.

Various modifications and changes may be applied to the examples of embodiments in accordance with the present disclosure so that the examples of embodiments will be illustrated in the drawings and described in the specification. However, the examples of embodiments according to the present disclosure are not limited to the specific embodiments, but include all changes, equivalents, or alternatives that are included in the spirit and technical scope of the present disclosure.

Like reference numerals are used for referring to the same or similar elements in the description and drawings. In the attached drawings, the dimensions of the components exaggerated for clarity of illustration. Terminologies such as first or second may be used to describe various components but the components are not limited by the above terminologies. The above terminologies are used to distinguish one component from the other component, for example, a first component may be referred to as a second component without departing from a scope in accordance with the present disclosure and similarly, a second component may be referred to as a first component. The terms of a singular form may include plural forms unless referred to the contrary.

In the present disclosure, it will be appreciated that terms "including" and "having" are intended to designate the existence of characteristics, numbers, steps, operations, constituent elements, and components described in the specification or a combination thereof, and do not exclude a possibility of the existence or addition of one or more other specific characteristics, numbers, steps, operations, constituent elements, and components, or a combination thereof in advance. It will be understood that when an element such as a layer, film, area, or substrate is referred to as being "on" another element, it can be directly on the other element or intervening elements may also be present. On the contrary, it will be understood that when an element such as a layer, film, area, or substrate is referred to as being "beneath" another element, it can be directly beneath the other element or intervening elements may also be present.

A display device according to exemplary embodiments of the present disclosure will now be described more fully with reference to the accompanying drawings.

Figure 2:
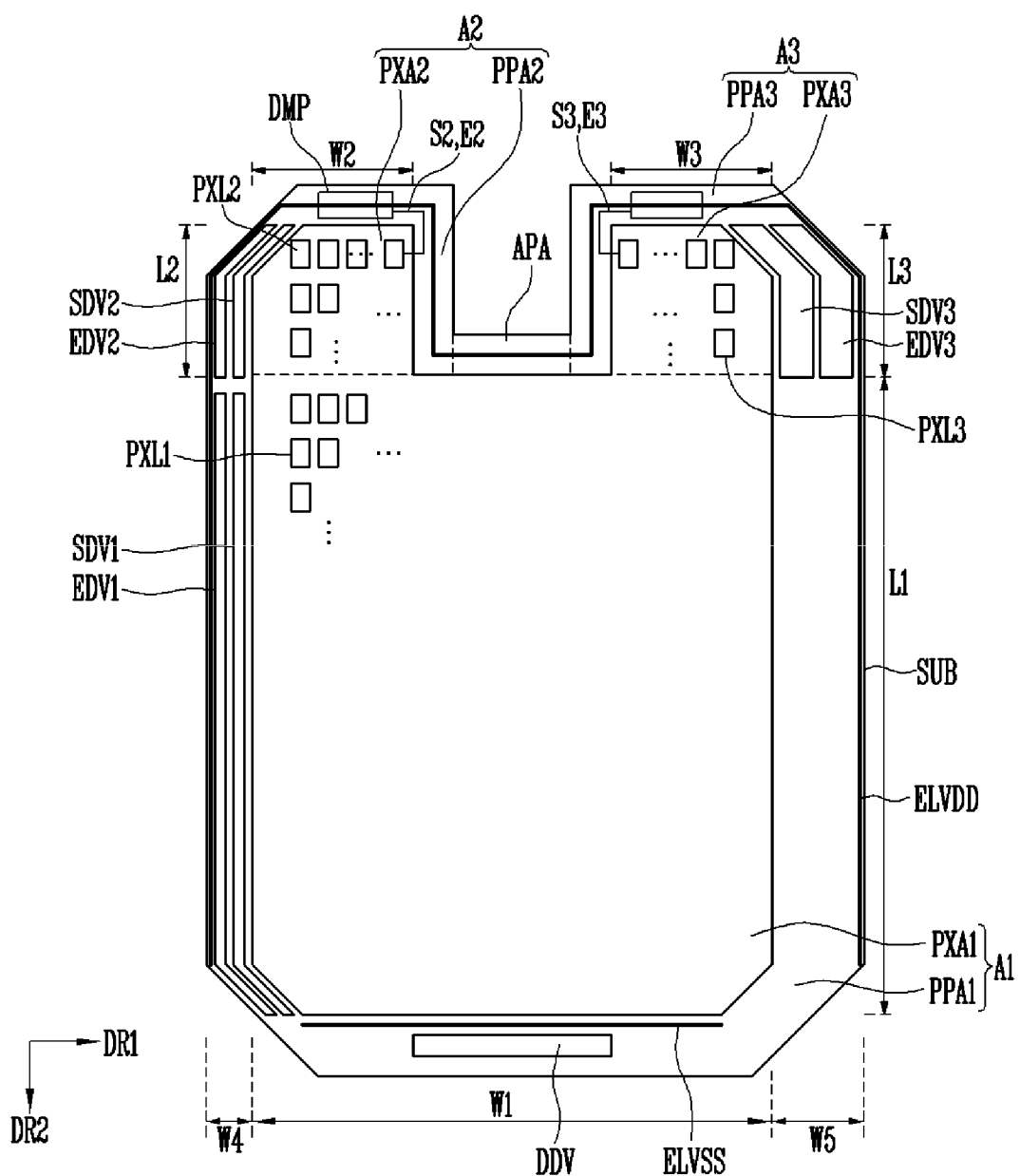

FIGS. 1 and 2 are plan views illustrating a display device, according to various embodiments.

The display device may include a substrate SUB, a plurality of pixels (PXL1, PXL2, and PXL3; hereinafter, 'PXL') provided on the substrate SUB, a driver provided on the substrate SUB and driving the pixels PXL, a power supply unit supplying power to the pixels PXL, and a line part connecting the pixels PXL and the driver to each other.

The substrate SUB may include a plurality of areas, at least two of which may include different sizes. According to one embodiment, the substrate SUB may have three areas. These three areas may have different sizes from each other, or two of the three areas may have different sizes. According to another embodiment, the substrate SUB may have four or more areas.

For convenience of explanation, the substrate SUB having three areas, i.e., first, second, and third areas A1, A2, and A3 is described below as an example.

Each of the first, second, and third areas A1, A2, and A3 may have various shapes. For example, each of the first, second, and third areas A1, A2, and A3 may have various shapes, such as a polygon having a closed shape including straight sides, a circle or an oval including curved sides, or a semi-circle or a semi-oval including straight and curved sides.

Referring to FIG. 1, each of the first, second, and third areas A1, A2, and A3 may have a substantially rectangular shape. Referring to FIG. 2, at least a corner portion each of the first, second, and third areas A1, A2, and A3 may have a width decreasing away from the boundaries between the second and third areas A2 and A3 and the first area A1. For example, an outer corner of the second and third areas A2 and A3 may be cut to have an oblique corner.

The first, second, and third areas A1, A2, and A3 may include the pixel areas (PXA1, PXA2, and PXA3; hereinafter, 'PXA') and peripheral areas (PPA1, PPA2, and PPA3; hereinafter, 'PPA'). The pixel areas PXA may refer to an area where the pixels PXL displaying an image are provided. The pixels PXL are described below.

According to one embodiment, the first, second, and third pixel areas PXA1, PXA2, and PXA3 may have substantially corresponding shapes to the first, second, and to third areas A1, A2, and A3, respectively.

The peripheral areas PPA may refer to an area where the pixels PXL are not provided, i.e., where an image is not displayed. The driver configured to drive the pixels PXL, the power supply unit configured to apply power to the pixels PXL, and some of lines (not illustrated) connecting the pixels PXL to the driver may be provided in the peripheral areas PPA. The peripheral areas PPA may correspond to a bezel of the display device, and a width of the bezel may be determined by a width of the peripheral areas PPA.

The first, second, and third areas A1, A2, and A3 are described below.

The first area A1, among the first, second, and third areas A1, A2, and A3, may have the largest area. The first area A1 may include the first pixel area PXA1 where an image is displayed and the first peripheral area PPA1 surrounding at least a portion of the first pixel area PXA1.

The first pixel area PXA1 may be provided to have a shape corresponding to the first area A1. According to one embodiment, the first pixel area PXA1 may have a first width W1 in a first direction DR1 and a first length L1 in a second direction DR2 that crosses the first direction DR1.

The first peripheral area PPA1 may be provided on at least one side of the first pixel area PXA1. According to one embodiment, the first peripheral area PPA1 may surround the circumference of the first pixel area PXA1 and be provided at any position except for positions where the second area A2 and the third area A3 are arranged. According to one embodiment, the first peripheral area PPA1 may include a horizontal portion extending in the first direction DR1 and vertical portions extending in the second direction DR2. The vertical portions of the first peripheral area PPA1 may be provided as a pair and separated from each other in the first direction DR1 by the first pixel area PXA1.

The second area A2 may have a smaller area than the first area A1. The second area A2 may include the second pixel area PXA2 where an image is displayed, and a second peripheral area PPA2 surrounding at least a portion of the second pixel area PXA2.

The second pixel area PXA2 may be provided to have a shape corresponding to the second area A2. According to one embodiment, the second pixel area PXA2 may have a second width W2 that is shorter than the first width W1 of the first pixel area PXA1. The second pixel area PXA2 may have a second length L2 that is shorter than the first length L1 of the first area A1. The second pixel area PXA2 may extend from the first pixel area PXA1 and be directly connected to the first pixel area PXA1. For example, one side of the second pixel area PXA2 may contact one side of the first pixel area PXA1.

The second peripheral area PPA2 may be provided on at least one side of the second pixel area PXA2. According to one embodiment, the second peripheral area PPA2 may surround the second pixel area PXA2 except portions where the first pixel area PXA1 and the second pixel area PXA2 are connected to each other. According to one embodiment, the second peripheral area PPA2 may include a horizontal portion extending in the first direction DR1 and vertical portions extending in the second direction DR2. The vertical portions of the second peripheral area PPA2 may be provided as a pair and separated from each other in the first direction DR1 by the second pixel area PXA2.

The third area A3 may have a smaller size than the first area A1. For example, the third area A3 may have substantially the same size as the second area A2. The third area A3 may include a third pixel area PXA3 where an image is displayed and a third peripheral area PPA3 surrounding at least a portion of the third pixel area PXA3.

The third pixel area PXA3 may have a corresponding shape to the third area A3. According to one embodiment, the third pixel area PXA3 may have a third width W3 that is shorter than the first width W1 of the first area A1. The third pixel area PXA3 may have a third length L3 that is shorter than the first length L1 of the first area A1. The second width W2 and the third width W3 may be substantially the same as each other. In addition, the second length L2 and the third length L3 may be substantially the same as each other.

The third pixel area PXA3 may extend from the first pixel area PXA1 and be directly connected to the first pixel area PXA1. For example, one side of the third pixel area PXA3 may contact one side of the first pixel area PXA1.

The third peripheral area PPA3 may be provided on at least one side of the third pixel area PXA3. According to one embodiment, the third peripheral area PPA3 may surround the third pixel area PXA3 except portions where the first pixel area PXA1 and the third pixel area PXA3 are connected to each other. According to one embodiment, the third peripheral area PPA3 may include a horizontal portion extending in the first direction DR1 and vertical portions extending in the second direction DR2. The vertical portions of the third peripheral area PPA3 may be provided as a pair and separated from each other in the first direction DR1 by the first pixel area PXA1.

According to one embodiment, the third area A3 and the second area A2 may have a line symmetry with respect to an imaginary center line extending in the second direction DR2 from an intermediate point of the horizontal portion of the first peripheral area PPA1 of the first area A1. The arrangement of the respective elements provided in the third area A3 may be substantially the same as that of the second area A2, except for some of the lines.

The second area A2 and the third area A3 may extend from the first area A1 of the substrate SUB in the second direction DR2. In addition, since the second area A2 and the third area A3 are separated from each other, a portion between the second area A2 and the third area A3 of the substrate SUB may be depressed. For example, the substrate SUB may have a notch between the second area A2 and the third area A3.

According to one embodiment, the vertical portions of the first peripheral area PPA1 may be connected to some of the vertical portions of the second peripheral area PPA2 and the third peripheral area PPA3. For example, the left vertical portion of the first peripheral area PPA1 and the left vertical portion of the second peripheral area PPA2 may be connected to each other, and the right vertical portion of the first peripheral area PPA1 and the right vertical portion of the third peripheral area PPA3 may be connected to each other. In addition, the left vertical portion of the first peripheral area PPA1 and the left vertical portion of the second peripheral area PPA2 may have the same width (W4; hereinafter 'fourth width'). The right vertical portion of the first peripheral area PPA1 and the right vertical portion of the third peripheral area PPA3 may have the same width (W5; hereinafter, 'fifth width').

The fourth width W4 may be different from the fifth width W5. For example, the fourth width W4 may be shorter than the fifth width W5.

According to one embodiment, the substrate SUB may further include an additional peripheral area APA. The additional peripheral area APA may be provided adjacent to the first pixel area PXA1, the second peripheral area PPA2, and the third peripheral area PPA3. For example, the additional peripheral area APA may connect the second peripheral area PPA2 and the third peripheral area PPA3 to each other. More specifically, the additional peripheral area APA may connect the right vertical portion of the second peripheral area PPA2 and the left vertical portion of the third peripheral area PPA3 to each other. In addition, the additional peripheral area APA may be provided on the side of the first pixel area PXA1 between the second area A2 and the third area A3.

The pixels PXL may be provided in the pixel areas PXA on the substrate SUB including the first, second, and third pixel areas PXA1, PXA2, and PXA3. Each of the pixels PXL may include a display element that emits light. For example, the display element may be any one of a liquid crystal display (LCD) device, an electrophoretic display (EPD) device, an electrowetting display device (EWD), and an organic light emitting display (OLED) device. Hereinafter, for convenience of explanation, the display element of an organic light emitting display device is described as an example.

Each of the pixels PXL may emit light of one of red, green, and blue. However, the present disclosure is not limited thereto. For example, each of the pixels PXL may emit light of cyan, magenta, yellow and white.

The pixels PXL may include first pixels PXL1 arranged in the first pixel area PXA1, second pixels PXL2 arranged in the second pixel area PXA2, and third pixels PXL3 arranged in the third pixel area PXA3. According to one embodiment, each of the first, second, and third pixels PXL1, PXL2, and PXL3 may be arranged in a matrix format including rows extending in the first direction DR1 and columns extending in the second direction DR2. However, the arrangement of the first, second, and third pixels PXL1, PXL2, and PXL3 may not be particularly limited thereto. In other words, the first, second, and third pixels PXL1, PXL2, and PXL3 may have various arrangements.

In the second area A2 and the third area A3, the number of second pixels PXL2 and the number of third pixels PXL3 may vary according to each row. Referring to FIG. 2, in the second area A2 and the third area A3, the number of second pixels PXL2 and the number of third pixels PXL3 arranged in a row corresponding to a sloped corner may be smaller than the number of second pixels PXL2 and the number of third pixels PXL3 arranged in a row corresponding to straight sides that are close to the first pixel area A1. In addition, the number of second pixels PXL2 and the number of third pixels PXL3 arranged in the row may decrease as the length of the row decreases. As a result, a length of a line connecting the second and third pixels PXL2 and PXL3 arranged in the sloped corner may be reduced.

The driver may supply a signal to each pixel through a corresponding line part so as to control the driving of each pixel PXL. FIGS. 1 and 2 illustrate only second and third scan lines S2 and S3 and second and third emission control lines E2 and E3 of the line part. The second scan line S2 and the second emission control line E2 may be provided in the second pixel area PXA2, and the third scan line S3 and the third emission control line E3 may be provided in the third pixel area PXA3. Particularly, the second scan line S2 and the second emission control line E2 may extend to the second peripheral area PPA2, and the third scan line S3 and the third emission control line E3 may extend to the third peripheral area PPA3. A detailed description of the line part is described below with reference to FIG. 3.

The driver may include scan drivers (SDV1, SDV2, and SDV3; hereinafter, 'SDV') supplying scan signals to the respective pixels PXL along scan lines, emission drivers (EDV1, EDV2, and EDV3; hereinafter, 'EDV') supplying emission control signals to the respective pixels PXL along emission control lines, a data driver DDV supplying data signals to the respective pixels PXL along data lines, and a timing controller (not illustrated). The timing controller may control the scan drivers SDV, the emission drivers EDV, and the data driver DDV.

According to one embodiment, the scan drivers SDV may include a first scan driver SDV1 connected to the first pixels PXL1, a second scan driver SDV2 connected to the second pixels PXL2, and a third scan driver SDV3 connected to the third pixels PXL3. According to one embodiment, the emission drivers EDV may include a first emission driver EDV1 connected to the first pixels PXL1, a second emission driver EDV2 connected to the second pixels PXL2, and a third emission driver EDV3 connected to the third pixels PXL3.

The first scan driver SDV1 may be disposed on at least one of the vertical portions of the first peripheral area PPA1. Since the vertical portions of the first peripheral area PPA1 are provided as a pair that is separated from each other in the first direction DR1 by the first pixel area PXA1, the first scan driver SDV1 may be disposed on at least one of the pair of vertical portions of the first peripheral area PPA1. The first scan driver SDV1 may extend in the second direction DR2.

In a similar manner, the second scan driver SDV2 may be provided in the second peripheral area PPA2, and the third scan driver SDV3 may be provided in the third peripheral area PPA3.

Similarly to the first scan driver SDV1, the first emission driver EDV1 may be disposed on at least one of the vertical portions of the first peripheral area PPA1. The first emission driver EDV1 may extend in the second direction DR2.

In a similar manner, the second emission driver EDV2 may be disposed in the second peripheral area PPA2, and the third emission driver EDV3 may be disposed in the third peripheral area PPA3.

The data driver DDV may be disposed in the first peripheral area PPA1. For example, the data driver DDV may be disposed in the horizontal portion of the first peripheral area PPA1. The data driver DDV may extend in the first direction DR1.

According to some embodiments, the locations of the scan drivers SDV, the emission drivers EDV, and/or the data driver DDV may be switched with each other if necessary.

The timing controller (not illustrated) may be connected to the first, second, and third scan drivers SDV1, SDV2, and SDV3, the first, second, and third emission drivers EDV1, EDV2, and EDV3, and the data driver DDV through various lines. However, the arrangement of the timing controller is not particularly limited thereto. For example, the timing controller may be mounted onto a printed circuit board and connected to the first, second, and third scan drivers SDV1, SDV2, and SDV3, the first, second, and third emission drivers EDV1, EDV2, and EDV3, and the data driver DDV through the printed circuit board. The printed circuit board may be a flexible printed circuit board and disposed at various locations such as one side surface of the substrate SUB or a rear surface of the substrate SUB.

The power supply unit may include one or more power supply lines. For example, the power supply unit may include a first power supply line ELVDD and a second power supply line ELVSS. The first power supply line ELVDD and the second power supply line ELVSS may apply power to the first pixels PXL1, the second pixels PXL2, and the third pixels PXL3.

One of the first power supply line ELVDD and the second power supply line ELVSS, for example, the second power supply line ELVSS may be disposed so as to correspond to at least one side of the first peripheral area PPA1, one side of the second peripheral area PPA2, and one side of the third peripheral area PPA3. For example, the second power supply line ELVSS may be disposed in the region where the data driver DDV of the first peripheral area PPA1 is disposed. In addition, the second power supply line ELVSS may extend in the first direction DR1 in the first peripheral area PPA1.

The other power supply line, i.e., the first power supply line ELVDD may be disposed to surround the first pixel area PXA1, the second pixel area PXA2 and the third pixel area PXA3, except the region where the data driver DDV of the first peripheral area PPA1 is disposed. For example, the first power supply line ELVDD may extend along the left vertical portion of the first peripheral area PPA1, the second peripheral area PPA2, the third peripheral area PPA3, the additional peripheral area APA, and the right vertical portion of the first peripheral area PPA1.

As described above, for example, the second power supply line ELVSS may be disposed in the first peripheral area PPA1 so as to correspond to one side of the first pixel area PXA1, and the first power supply line ELVDD is disposed in the remaining peripheral areas PPA. However, the present disclosure is not limited thereto. For example, the first power supply line ELVDD and the second power supply line ELVSS may be disposed to surround the first pixel area PXA1, the second pixel area PXA2, and the third pixel area PXA3.

A voltage applied to the first power supply line ELVDD may be higher than a voltage applied to the second power supply line ELVSS.

A length of the second scan line S2 provided in the second pixel area PXA2 and a length of the third scan line S3 provided in the third pixel area PXA3 may be different from a length of the first scan line provided in the first pixel area PXA1. In the same manner, a length of the second emission control line E2 connected to the second pixel area PXA2 and a length of the third emission control line E3 connected to the third pixel area PXA3 may be different from a length of a first emission control line E1 connected to the first pixel area PXA1. The difference in length of the lines provided in the pixel areas PXA may cause a difference in a load value of the pixel areas PXA.

According to one embodiment, to compensate for the difference in a load value between the respective pixel areas PXA, a dummy part DMP having a different parasitic capacitance may be used in the peripheral area PPA corresponding to each pixel area PXA. According to one embodiment, the dummy part DMP may be disposed in each of the second peripheral area PPA2 and the third peripheral area PPA3. However, the present disclosure is not limited thereto. The dummy part DMP is described below with reference to FIG. 8.

Figure 3:
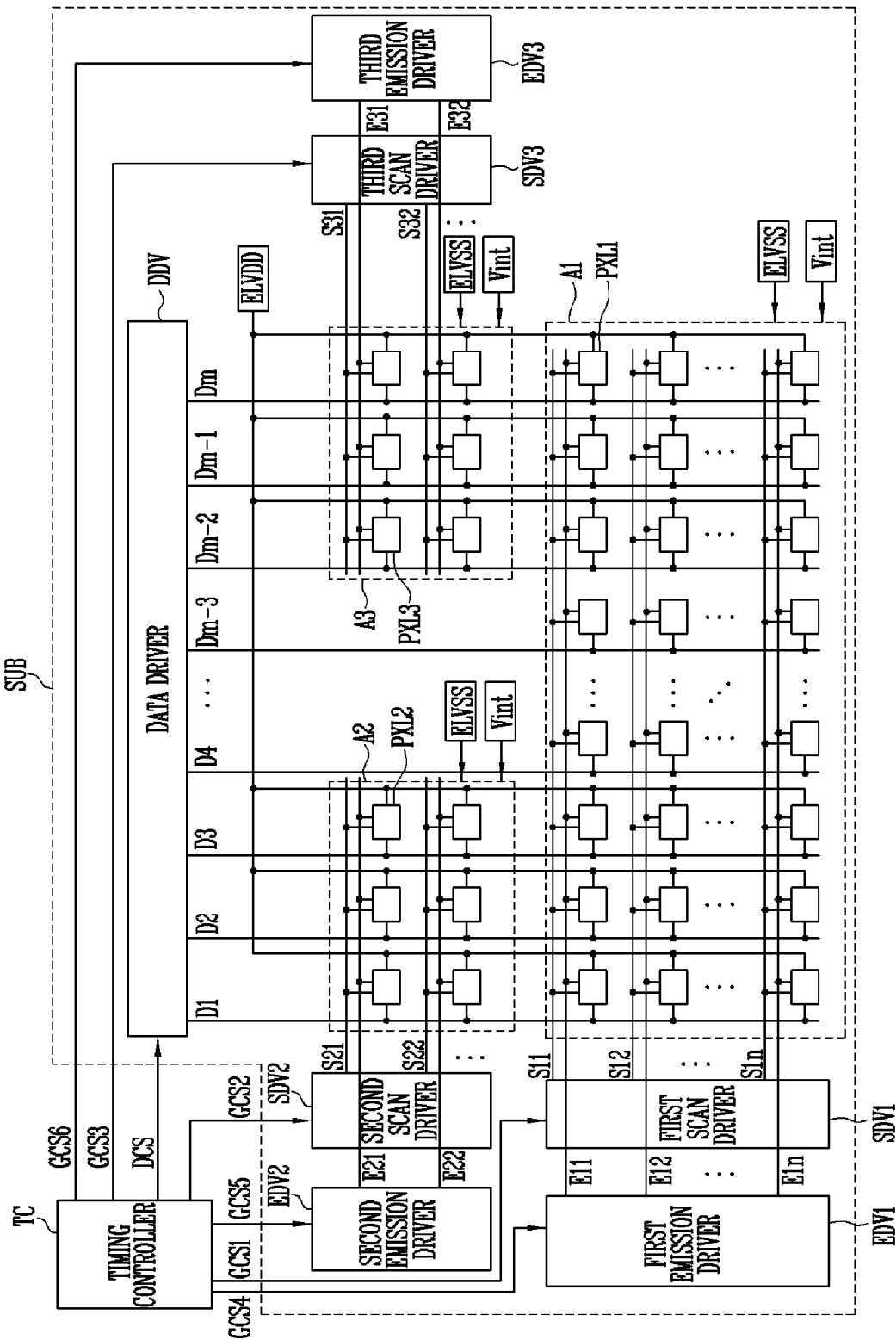
FIG. 3 is a block diagram illustrating an embodiment of pixels and a driver of a display device shown in FIG. 1.

FIG. 3 is a block diagram illustrating an embodiment of pixels and a driver of the display device shown in FIG. 1. In FIG. 3, for convenience of explanation, the first power supply is denoted by the same reference characters as the first power supply line ELVDD shown in FIG. 1, and the second power supply is denoted by the same reference characters as the second power supply line ELVSS as shown in FIG. 1.

Referring to FIGS. 1 and 3, the display device according to one embodiment may include the pixels PXL, the driver, and the line part.

The pixels PXL may include the first, second, and third pixels PXL1, PXL2, and PXL3, and the driver may include the first, second, and third scan drivers SDV1, SDV2, and SDV3, the first, second, and third emission drivers EDV1, EDV2, and EDV3, the data driver DDV, and a timing controller TC. In FIG. 3, the locations of the first, second, and third scan drivers SDV1, SDV2, and SDV3, the first, second, and third emission drivers EDV1, EDV2, and EDV3, the data driver DDV, and the timing controller TC are shown for convenience of explanation. At the time of manufacturing the display device, these locations may be changed in the display device. For example, the data driver DDV may be disposed more adjacent to the second area A2 and the third area A3 than to the first area A1. However, the present disclosure is not limited thereto. For example, the data driver DDV may be disposed in an area adjacent to the first area A1.

The line part supplying various signals from the driver to each of the pixel PXL may include scan lines, data lines D1 to Dm, emission control lines, the first power supply line ELVDD, the second power supply line ELVSS (see FIG. 1) and an initialization power supply line (not illustrated). The scan lines may include first, second, and third scan lines S11 to S1n, S21 and S22, and S31 and S32 connected to the first, second, and third pixels PXL1, PXL2, and PXL3, respectively. The emission control lines may include first, second, and third emission control lines E11 to E1n, E21 to E22, and E31 to E32 connected to the first, second, and third pixels PXL1, PXL2, and PXL3, respectively. The data lines D1 to Dm and the first and second power supply lines ELVDD and ELVSS may be connected to the first, second, and third pixels PXL1, PXL2, and PXL3, respectively.

The first pixels PXL1 may be disposed in the first pixel area PXA1. The first pixels PXL1 may be connected to the first scan lines S11 to S1n, the first emission control lines E11 to E1n, and the data lines D1 to Dm. The first pixels PXL1 may receive data signals from the data lines D1 to Dm when scan signals are supplied from the first scan lines S11 to S1n. The first pixels PXL1 receiving the data signals may control an amount of current flowing from the first power supply ELVDD via an organic light emitting diode OLED to the second power supply ELVSS.

The second pixels PXL2 may be disposed in the second pixel area PXA2. The second pixels PXL2 may be connected to the second scan lines S21 and S22, the second emission control lines E21 to E22, and the data lines D1 to D3. The second pixels PXL2 may receive data signals from the data lines D1 to Dm when scan signals are supplied from the second scan lines S21 and S22. The second pixels PXL2 receiving the data signals may control an amount of current flowing from the first power supply ELVDD via the organic light emitting device to the second power supply ELVSS.

The third pixels PXL3 may be disposed in the third pixel area PXA3. The third pixels PXL3 may be connected to the third scan lines S31 to S32, the third emission control lines E31 to E32, and the data lines D1 to Dm. The third pixels PXL3 may receive data signals from the data lines D1 to Dm when scan signals are supplied from the third scan lines S31 to S32. The third pixels PXL3 receiving the data signals may control an amount of current flowing from the first power supply ELVDD via the organic light emitting device to the second power supply ELVSS.

The first scan driver SDV1 may supply scan signals to the first scan lines S11 to S1n in response to a first gate control signal GCS1 from the timing controller TC. For example, the first scan driver SDV1 may sequentially supply the scan signals to the first scan lines S11 to S1n. When the scan signals are sequentially supplied to the first scan lines S11 to S1n, the first scan driver SDV1 may sequentially select the first pixels PXL1 arranged in horizontal lines.

The second scan driver SDV2 may supply scan signals to the second scan lines S21 and S22 in response to a second gate control signal GCS2 from the timing controller TC. For example, the second scan driver SDV2 may sequentially select the second pixels PXL2 arranged in horizontal lines when the scan signals are sequentially supplied to the second scan lines S21 and S22.

The third scan driver SDV3 may supply scan signals to the third scan lines S31 and S32 in response to a third gate control signal GCS3 from the timing controller TC. For example, the third scan driver SDV may sequentially select the third pixels PXL3 arranged in horizontal lines when the scan signals are supplied to the third scan lines S31 and S32.

The first emission driver EDV1 may supply emission control signals to the first emission control lines E11 to E1n in response to a fourth gate control signal GCS4 from the timing controller TC. For example, the first emission driver EDV1 may sequentially supply the emission control signals to the first emission control lines E11 to E1n.

The emission control signals may be set to have a greater width than the scan signals. For example, an emission control signal supplied to an i-th first emission control line E1i may be supplied to overlap with at least a portion of a period during which scan signals are respectively supplied to an (i−1)th first scan line S1i−1 and an i-th first scan line S1i, where i is a natural number.

The second emission driver EDV2 may supply emission control signals to the second emission control lines E21 to E22 in response to a fifth gate control signal GCS5 from the timing controller TC. For example, the second emission driver EDV2 may sequentially supply the emission control signals to the second emission control lines E21 to E22.

The third emission driver EDV3 may supply emission control signals to the third emission control lines E31 and E32 in response to a sixth gate control signal GCS6 from the timing controller TC. For example, the third emission driver EDV3 may sequentially supply the emission control signals to the third emission control lines E31 and E32.

In addition, the emission control signals may be set to a gate off voltage (e.g., a high voltage) so that transistors included in the pixels PXL may be turned off, and the scan signals may be set to a gate on voltage (e.g., a low voltage) so that the transistors included in the pixels PXL may be turned on.

The data driver DDV may supply data signals to the data lines D1 to Dm in response to a data control signal DCS. The data signals supplied to the data lines D1 to Dm may be supplied to the pixels PXL selected by the scan signals.

The timing controller TC may supply the first to sixth gate control signals GCS1 to GCS6 generated based on externally supplied timing signals to the scan drivers SDV and the emission drivers EDV and supply the data control signal DCS to the data driver DDV.

Each of the first to sixth gate control signals GCS1 to GCS6 may include a start pulse and clock signals. The start pulse may control the timing of the first scan signal or the first emission control signal. The clock signals may be used to shift the start pulse.

The data control signal DCS may include a source start pulse and clock signals. The source start pulse may control a sampling start point of data. The clock signals may be applied to control a sampling operation.

As described above, in the display device according to one embodiment, the pixels PXL may be provided in the areas A1, A2, and A3 having different sizes. Lengths of the scan lines S11 to S1n, S21 to S22, and S31 to S32 and the emission control lines E11 to E1n, E21 to E22, and E31 to E32 supplying signals to the pixels PXL may vary depending on the areas A1, A2, and A3, more specifically, depending on the sizes of the pixel areas PXA. For example, the first width W1 in the first pixel area PXA1 may be greater than the second width W2 in the second pixel area PXA2 as shown in FIG. 1. Therefore, when the scan lines S11 to S1n, S21 to S22, and S31 to S32 and the emission control lines E11 to E1n, E21 to E22, and E31 to E32 extend in a width direction (e.g., the first direction DR1), the first scan lines S11 to S1n and the first emission control lines E11 to E1n may have greater lengths than the second scan lines S21 and S22 and the second emission control lines E21 to E22, respectively. The difference in length of the scan lines S11 to S1n, S21 to S22, and S31 to S32 and the difference in length of the emission control lines E11 to E1n, E21 to E22, and E31 to E32 may cause a difference in a load value between the scan lines S11 to S1n, S21 to S22, and S31 to S32 and a difference in a load value between the emission control lines E11 to E1n, E21 to E22, and E31 to E32, respectively. In other words, the first scan lines S11 to S1n may have greater load values than the second scan lines S21 and S22. In addition, the first emission control lines E11 to E1n may have greater load values than the second emission control lines E21 and E22. A drop of the data signals may cause a brightness difference between the first pixels PXL1 of the first pixel area PXA1 and the second pixels PXL2 of the second pixel area PXA2. Since the third pixels PXL3 of the third pixel area PXA3 may have the same configuration as the second pixels PXL2, a detailed description of the third pixels PXL3 will be omitted.

Figure 4:
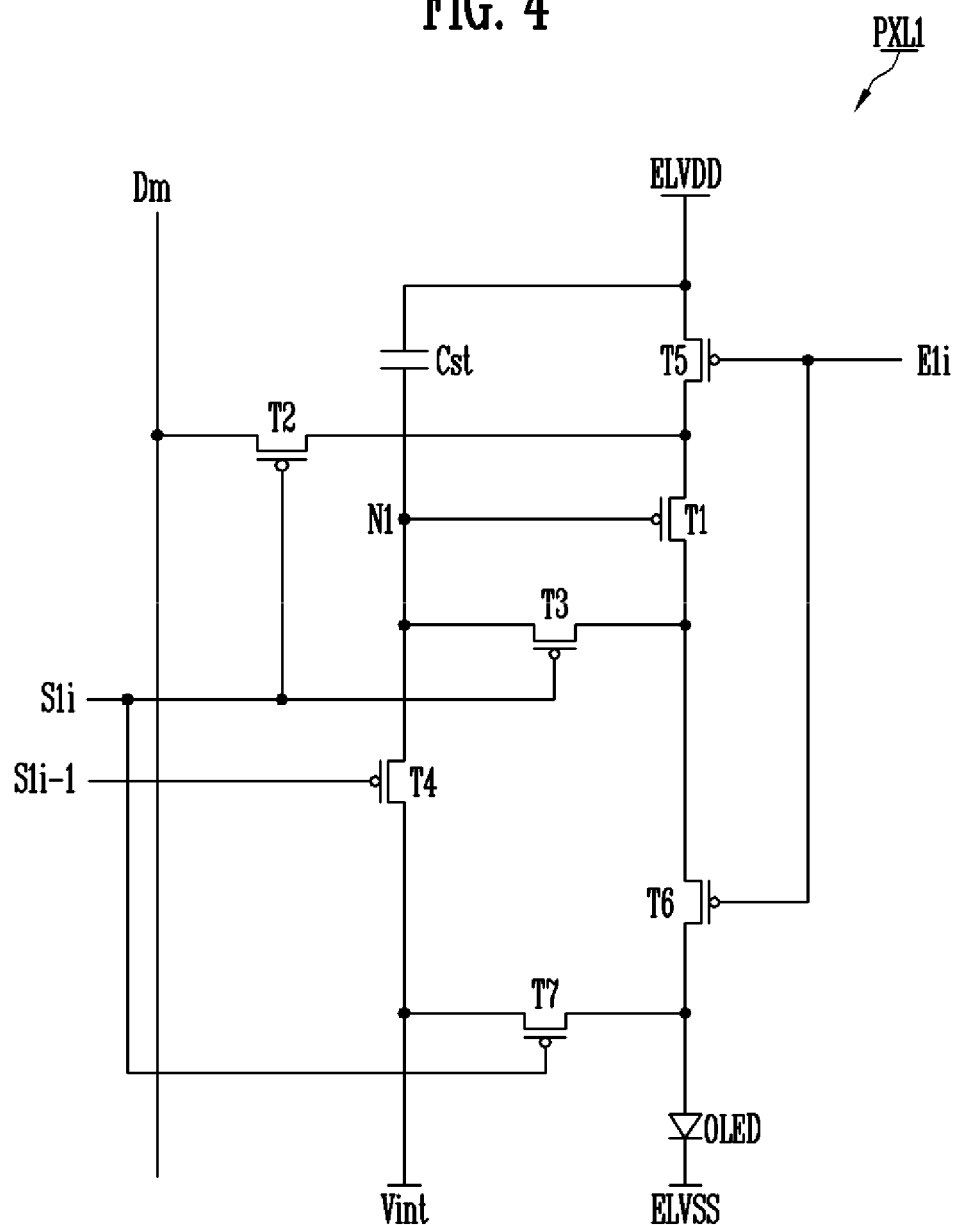
FIG. 4 is a circuit diagram of an embodiment of a first pixel shown in FIG. 3.

FIG. 4 is a circuit diagram of an embodiment of one of the first pixels PXL1 shown in FIG. 3. For convenience of explanation, FIG. 4 illustrates a pixel connected to an m-th data line Dm and the i-th first scan line S1i.

Referring to FIGS. 3 and 4, the first pixel PXL1 may include the organic light emitting diode OLED, first to seventh transistors T1 to T7, and a storage capacitor Cst.

An anode of the organic light emitting diode OLED may be connected to the first transistor T1 via the sixth transistor T6 and a cathode thereof may be connected to the second power supply ELVSS. The organic light emitting diode OLED may generate light with a brightness in response to the amount of current supplied from the first transistor T1.

The first power supply ELVDD may be set to have a greater voltage than the second power supply ELVSS so that current may flow through the organic light emitting diode OLED.

The seventh transistor T7 may be connected between an initialization power supply Vint and the anode of the organic light emitting diode OLED. In addition, a gate electrode of the seventh transistor T7 may be connected to the i-th first scan line S1i. The seventh transistor T7 may be turned on when a scan signal is supplied to the i-th first scan line S1i to supply a voltage of the initialization power supply Vint to the anode of the organic light emitting diode OLED. The initialization power supply Vint may be set to have a lower voltage than a data signal.

The sixth transistor T6 may be connected between the first transistor T1 and the organic light emitting diode OLED. In addition, a gate electrode of the sixth transistor T6 may be connected to the i-th first emission control line E1i. The sixth transistor T6 may be turned off when an emission control signal is supplied to the i-th first emission control line E1i and turned on for a remaining period.

The fifth transistor T5 may be connected between the first power supply ELVDD and the first transistor T1. In addition, a gate electrode of the fifth transistor T5 may be connected to the i-th first emission control line E1i. The fifth transistor T5 may be turned off when an emission control signal is supplied to the i-th first emission control line E1$i$ and turned on for a remaining period.

A first electrode of the first transistor T1 (driving transistor) may be connected to the first power supply ELVDD via the fifth transistor T5, and a second electrode of the first transistor T1 may be connected to the anode of the organic light emitting diode OLED via the sixth transistor T6. In addition, a gate electrode of the first transistor T1 may be connected to a first node N1. The first transistor T1 may control an amount of current flowing from the first power supply ELVDD via the organic light emitting diode OLED to the second power supply ELVSS in response to a voltage of the first node N1.

The third transistor T3 may be connected between the second electrode of the first transistor T1 and the first node N1. In addition, a gate electrode of the third transistor T3 may be connected to the i-th first scan line S1$i$. The third transistor T3 may be turned on when a scan signal is supplied to the i-th first scan line S1$i$ to electrically connect the second electrode of the first transistor T1 to the first node N1. Therefore, when the third transistor T3 is turned on, the first transistor T1 may be connected as a diode.

The fourth transistor T4 may be connected between the first node N1 and the initialization power supply Vint. In addition, a gate electrode of the fourth transistor T4 may be connected to the (i−1)th first scan line S1$i$−1. The fourth transistor T4 may be turned on when a scan signal is supplied to an (i−1)th first scan line S1$i$−1 to supply the voltage of the initialization power supply Vint to the first node N1.

The second transistor T2 may be connected between the m-th data line Dm and the first electrode of the first transistor T1. In addition, a gate electrode of the second transistor T2 may be connected to the i-th first scan line S1$i$. The second transistor T2 may be turned on when a scan signal is supplied to the i-th first scan line S1$i$ to electrically connect the m-th data line Dm to the first electrode of the first transistor T1.

The storage capacitor Cst may be connected between the first power supply ELVDD and the first node N1. The storage capacitor Cst may store a voltage corresponding to the data signal and a threshold voltage of the first transistor T1.

The second pixel PXL2 and the third pixel PXL3 may have the same circuit as the first pixel PXL1. Therefore, a detailed description of the second pixel PXL2 and the third pixel PXL3 is omitted.

Figure 5:
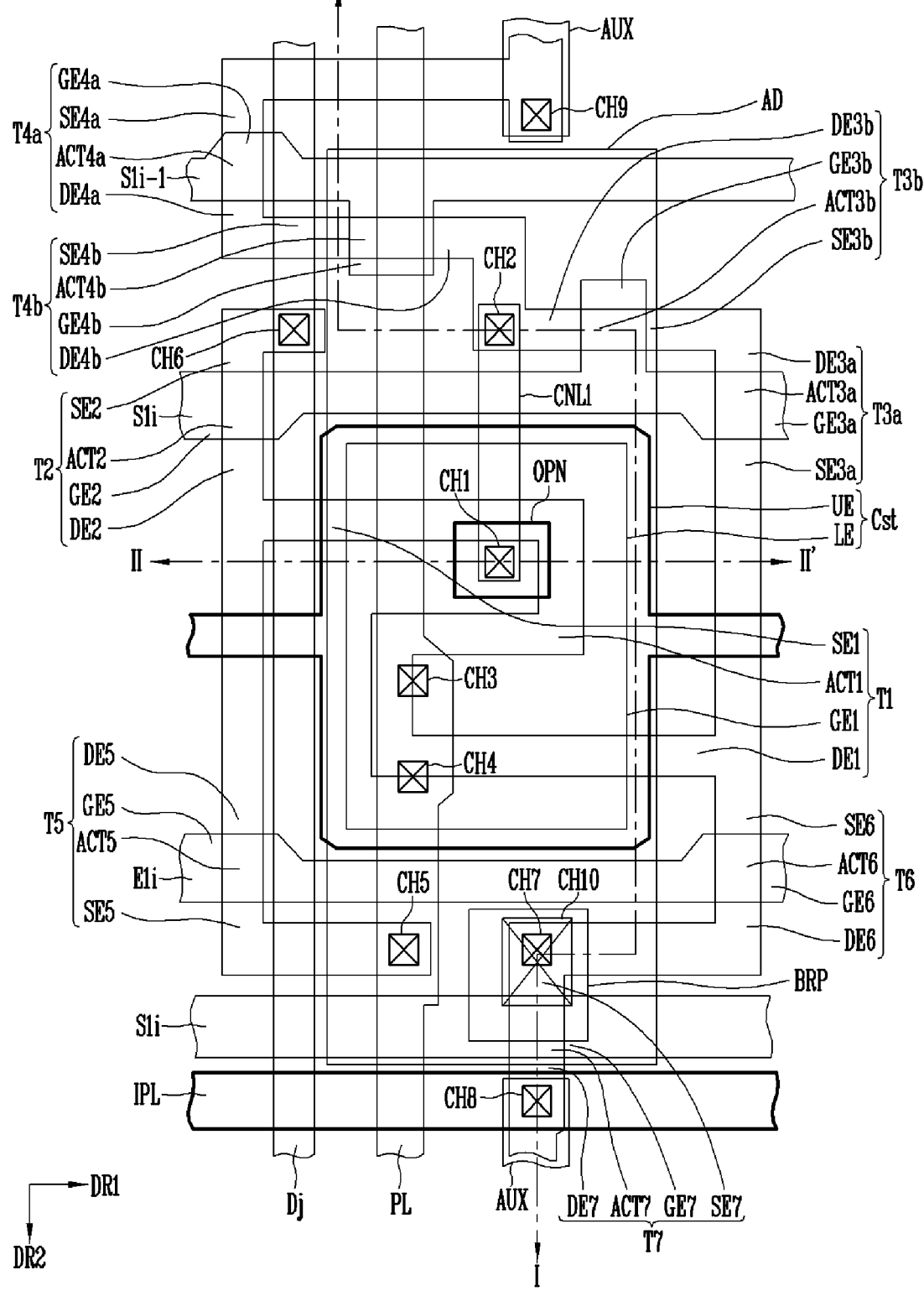
FIG. 5 is a detailed plan view illustrating a first pixel shown in FIG. 4.
Figure 6:
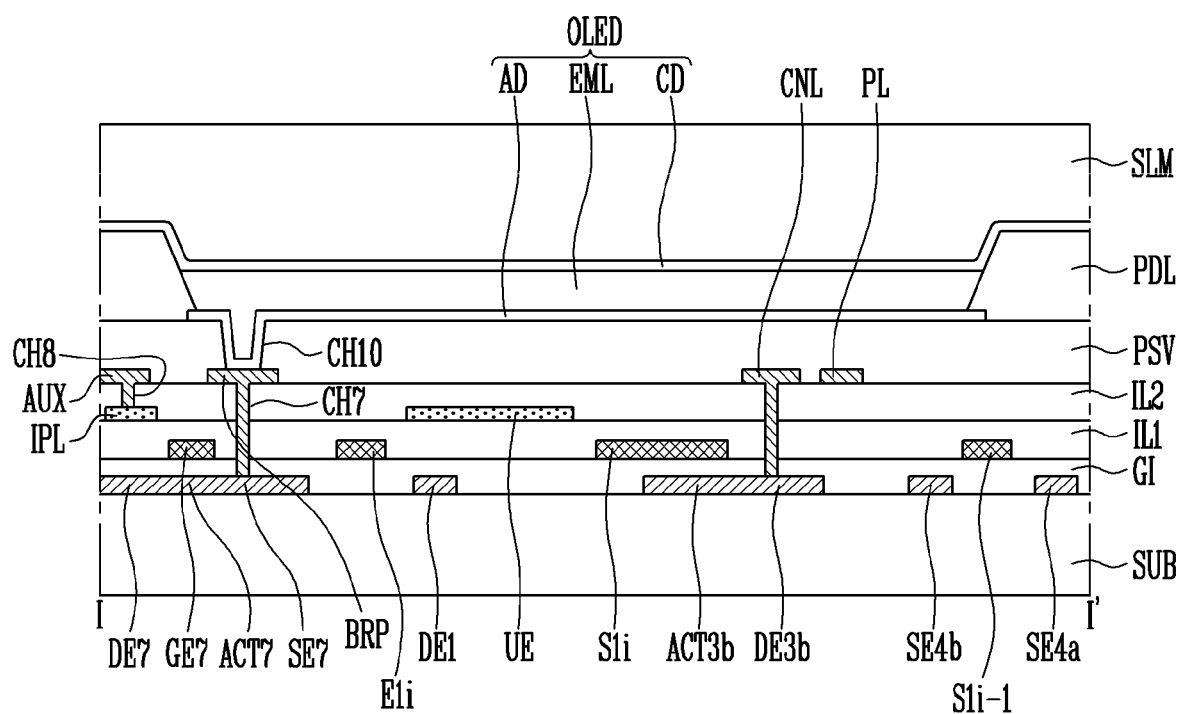
FIG. 6 is a cross-sectional view taken along line I-I' of FIG. 5.
Figure 7:
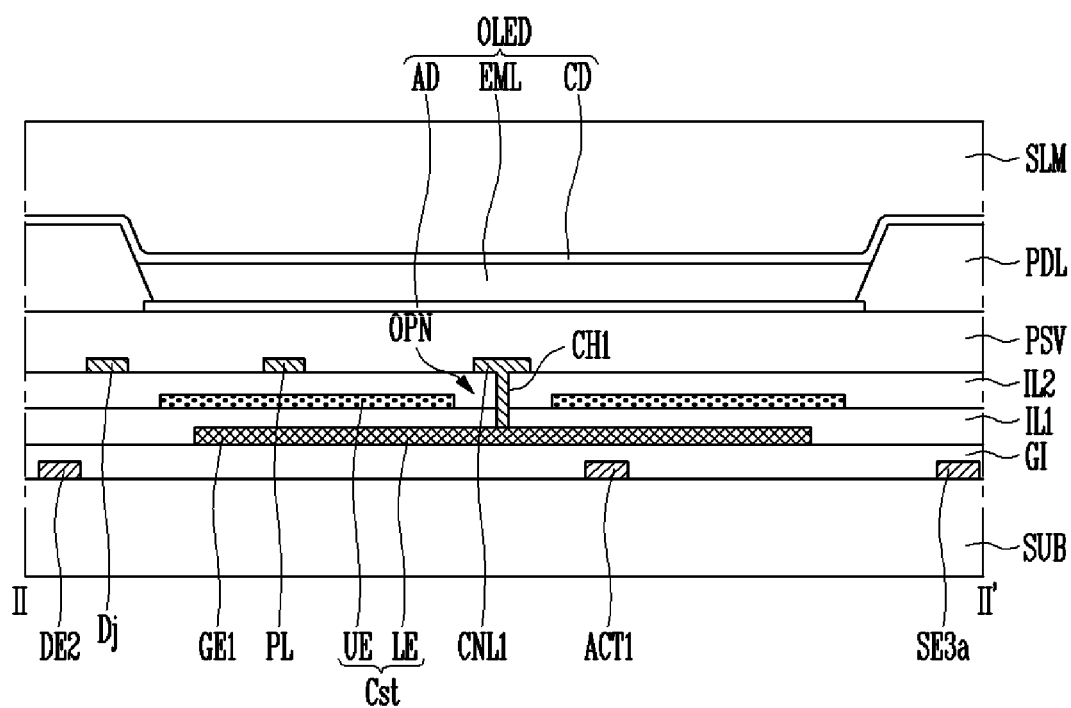
FIG. 7 is a cross-sectional view taken along line II-II' of FIG. 5.

FIG. 5 is a detailed plan view of the first pixel shown in FIG. 4. FIG. 6 is a cross-sectional view taken along line I-I' of FIG. 5. FIG. 7 is a cross-sectional view taken along line II-IT of FIG. 5. FIGS. 5 to 7 illustrate the two first scan lines S1$i$−1 and S1$i$, the first emission control line E1$i$, a power supply line PL, and a data line Dj that are connected to one first pixel PXL1 arranged in an i-th row and a j-th column in the first pixel area PXA1 on the basis of the first pixel PXL1. For convenience of explanation, FIGS. 5 to 7 illustrate a first scan line in an (i−1)th row as an "(i−1)th first scan line S1$i$−1", a first scan line in the i-th row as the "i-th first scan line S1$i$", an emission control line in the i-th row as the "emission control line E1$i$", a data line in the j-th row as the "data line Dj", and a power supply line in the j-th row as the "power supply line PL".

Referring to FIGS. 4 to 7, a display device according to one embodiment may include the substrate SUB, the line part, and the pixels, for example, the first pixels PXL1.

The substrate SUB may include a transparent insulating material to transmit light. In one embodiment, the substrate SUB may be a rigid substrate. For example, the substrate SUB may be one of a glass substrate, a quartz substrate, a glass ceramic substrate, and a crystalline glass substrate.

In some embodiments, the substrate SUB may be a flexible substrate. The substrate SUB may be one of a plastic substrate and a film substrate including a high molecular organic material. For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the substrate SUB may include various materials in addition to the above materials. For example, the substrate SUB may include fiber reinforced plastic (FRP).

The line part may supply signals to the first pixels PXL1 and include the first scan lines S1$i$−1 and S1$i$, the data line Dj, the emission control line E1$i$, the power supply line PL, and an initialization power supply line IPL.

The first scan lines S1$i$−1 and S1$i$ may extend in the first direction DR1. The first scan lines S1$i$−1 and S1$i$ may include the (i−1)th first scan line S1$i$−1 and the i-th first scan line S1$i$ that are sequentially arranged in the second direction DR2 that crosses the first direction DR1. The first scan lines S1$i$−1 and S1$i$ may receive scan signals. For example, the (i−1)th first scan line S1$i$−1 may receive an (i−1)th scan signal and the i-th first scan line S1$i$ may receive an i-th scan signal. The i-th first scan line S1$i$ may be branched into two lines, and the two lines into which the i-th first scan line S1$i$ is branched may be connected to different transistors. For example, the i-th first scan line S1$i$ may include an upper i-th first scan line S1$i$ that is adjacent to the (i−1)th first scan line S1$i$−1 and a lower i-th first scan line S1$i$ that is distant from the (i−1)th first scan line S1$i$−1 than the upper i-th first scan line S1$i$.

The emission control line E1$i$ may extend in the first direction DR1. The emission control line E1$i$ may be separated from the (i−1)th first scan line S1$i$−1 and the i-th first scan lines S1$i$ and arranged between the two first scan lines S1$i$−1 and S1$i$. The emission control line E1$i$ may receive an emission control signal.

The data line Dj may extend in the second direction DR2 and receive a data signal.

The power supply line PL may extend in the second direction DR2. The power supply line PL may be separated from the data line Dj. The power supply line PL may receive the first power signal through the first power supply line ELVDD.

The initialization power supply line IPL may extend in the first direction DR1. The initialization power supply line IPL may be provided between the i-th first scan line S1$i$ and the (i−1)th first scan line S1$i$−1 of a pixel. The initialization power supply line IPL may receive the initialization power supply Vint.

Each of the first pixels PXL1 may include the first to seventh transistors T1 to T7, the storage capacitor Cst, and the organic light emitting diode OLED.

The first transistor T1 may include a first gate electrode GE1, a first active pattern ACT1, a first source electrode SE1, a first drain electrode DE1, and a first connection line CNL1.

The first gate electrode GE1 may be connected to a third drain electrode DE3 of the third transistor T3 and a fourth drain electrode DE4 of the fourth transistor T4.

The first connection line CNL1 may connect the first gate electrode GE1 to the third and fourth drain electrodes DE3 and DE4. One end of the first connection line CNL1 may be connected to the first gate electrode GE1 through a first contact hole CH1, and the other end of the first connection line CNL1 may be connected to the third and fourth drain electrodes DE3 and DE4 through a second contact hole CH2.

According to one embodiment, each of the first active pattern ACT1, the first source electrode SE1, and the first drain electrode DEI may include a semiconductor layer, and the semiconductor layer may or may not be doped with impurities. For example, the first source electrode SE1 and the first drain electrode DE1 may include a semiconductor layer that is doped with impurities, and the first active pattern ACT1 may include a semiconductor layer that is not doped with impurities.

The first active pattern ACT1 may have a bar shape extending in a length direction and be bent a plurality of times in the extending length direction. The first active pattern ACT1 may overlap with the first gate electrode GE1 as viewed in the plane. Since the first active pattern ACT1 extends in the length direction, a channel region of the first transistor T1 may also extend in the same length direction. Therefore, a driving range of a gate voltage applied to the first transistor T1 may be widened. Therefore, it is possible to minutely control a grayscale of light emitted from the organic light emitting diode OLED.

The first source electrode SE1 may be connected to one end of the first active pattern ACT1. The first source electrode SE1 may be connected to the second drain electrode DE2 of the second transistor T2 and a fifth drain electrode DE5 of the fifth transistor T5. The first drain electrode DE1 may be connected to the other end of the first active pattern ACT1. The first drain electrode DE1 may be connected to a third source electrode SE3 of the third transistor T3 and a sixth source electrode SE6 of the sixth transistor T6.

The second transistor T2 may include a second gate electrode GE2, a second active pattern ACT2, a second source electrode SE2, and the second drain electrode DE2.

The second gate electrode GE2 may be connected to the upper i-th first scan line S1i. The second gate electrode GE2 may be provided as a portion of the upper i-th first scan line S1i or protrude from the upper i-th first scan line S1i. According to one embodiment, each of the second active pattern ACT2, the second source electrode SE2, and the second drain electrode DE2 may be a semiconductor layer, and the semiconductor layer may or may not be doped with impurities. For example, each of the second source electrode SE2 and the second drain electrode DE2 may include a semiconductor layer that is doped with impurities, whereas the second active pattern ACT2 may include a semiconductor layer that is not doped with impurities. The second active pattern ACT2 may overlap with the second gate electrode GE2. One end of the second source electrode SE2 may be connected to the second active pattern ACT2. The other end of the second source electrode SE2 may be connected to the data line Dj through a sixth contact hole CH6. One end of the second drain electrode DE2 may be connected to the second active pattern ACT2. The other end of the second drain electrode DE2 may be connected to the first source electrode SE1 of the first transistor T1 and a fifth drain electrode DE5 of the fifth transistor T5.

The third transistor T3 may have a dual gate structure capable of preventing current leakage. For example, the third transistor T3 may include a 3a-th transistor T3$a$ and a 3b-th transistor T3$b$. The 3a-th transistor T3$a$ may include a 3a-th gate electrode GE3$a$, a 3a-th active pattern ACT3$a$, a 3a-th source electrode SE3$a$, and a 3a-th drain electrode DE3$a$. The 3b-th transistor T3$b$ may include a 3b-th gate electrode GE3$b$, a 3b-th active pattern ACT3$b$, a 3b-th source electrode SE3$b$, and a 3b-th drain electrode DE3$b$. Hereinafter, the 3a-th gate electrode GE3$a$ and the 3b-th gate electrode GE3$b$ may be collectively referred to as a third gate electrode GE3, the 3a-th active pattern ACT3$a$ and the 3b-th active pattern ACT3$b$ may be collectively referred to as a third active pattern ACT3, the 3a-th source electrode SE3$a$ and the 3b-th source electrode SE3$b$ may be collectively referred to as a third source electrode SE3, and the 3a-th drain electrode DE3$a$ and the 3b-th drain electrode DE3$b$ may be collectively referred to as a third drain electrode DE3.

The third gate electrode GE3 may be connected to the upper i-th first scan line S1$i$. The third gate electrode GE3 may be provided as a portion of the upper i-th first scan line S1$i$ or extend from the upper i-th first scan line S1$i$. For example, the 3a-th gate electrode GE3$a$ may protrude from the upper i-th first scan line S1$i$, and the 3b-th gate electrode GE3$b$ may be provided as the upper i-th first scan line S1$i$.

Each of the third active pattern ACT3, the third source electrode SE3, and the third drain electrode DE3 may include a semiconductor layer, and the semiconductor layer may or may not be doped with impurities. For example, the third source electrode SE3 and the third drain electrode DE3 may include a semiconductor layer that is doped with impurities, and the third active pattern ACT3 may include a semiconductor layer that is not doped with impurities. The third active pattern ACT3 may overlap with the third gate electrode GE3. One end of the third source electrode SE3 may be connected to the third active pattern ACT3. The other end of the third source electrode SE3 may be connected to the first drain electrode DE1 of the first transistor T1 and the sixth source electrode SE6 of the sixth transistor T6. One end of the third drain electrode DE3 may be connected to the third active pattern ACT3. The other end of the third drain electrode DE3 may be connected to the fourth drain electrode DE4 of the fourth transistor T4. In addition, the third drain electrode DE3 may be connected to the first gate electrode GE1 of the first transistor T1 through the first connection line CNL1, the second contact hole CH2, and the first contact hole CH1.

The fourth transistor T4 may have a dual gate structure capable of preventing current leakage. For example, the fourth transistor T4 may include a 4a-th transistor T4$a$ and a 4b-th transistor T4$b$. The 4a-th transistor T4$a$ may include a 4a-th gate electrode GE4$a$, a 4a-th active pattern ACT4$a$, a 4a-th source electrode SE4$a$, and a 4a-th drain electrode DE4$a$. The 4b-th transistor T4$b$ may include a 4b-th gate electrode GE4$b$, a 4b-th active pattern ACT4$b$, a 4b-th source electrode SE4$b$, and a 4b-th drain electrode DE4$b$. Hereinafter, the 4a-th gate electrode GE4$a$ and the 4b-th gate electrode GE4$b$ may be collectively referred to as a fourth gate electrode GE4, the 4a-th active pattern ACT4$a$ and the 4b-th active pattern ACT4$b$ may be collectively referred to as a fourth active pattern ACT4, the 4a-th source electrode SE4$a$ and the 4b-th source electrode SE4$b$ may be collectively referred to as a fourth source electrode SE4, and the 4a-th drain electrode DE4$a$ and the 4b-th drain electrode DE4$b$ may be collectively referred as a fourth drain electrode DE4.

The fourth gate electrode GE4 may be connected to the (i−1)th first scan line S1$i$−1. The fourth gate electrode GE4 may be provided as a portion of the (i−1)th first scan line S1$i$–1 or extend from the (i–1)th first scan line S1$i$–1. For example, the 4a-th gate electrode GE4$a$ may be provided as the (i–1)th first scan line S1$i$–1. The 4b-th gate electrode GE4$b$ may protrude from the (i–1)th first scan line S1$i$–1.

Each of the fourth active pattern ACT4, the fourth source electrode SE4, and the fourth drain electrode DE4 may include a semiconductor layer, and the semiconductor layer may or may not be doped with impurities. For example, the fourth source electrode SE4 and the fourth drain electrode DE4 may include a semiconductor layer that is doped with impurities, and the fourth active pattern ACT4 may include a semiconductor layer that is not doped with impurities. The fourth active pattern ACT4 may overlap the fourth gate electrode GE4.

One end of the fourth source electrode SE4 may be connected to the fourth active pattern ACT4. The other end of the fourth source electrode SE4 may be connected to the initialization power supply line IPL of the first pixel PXL1 in an (i–1)th row and a seventh drain electrode DE7 connected to the seventh transistor T7 of the first pixel PXL1 in the (i–1)th row. An auxiliary connection line AUX may be provided between the fourth source electrode SE4 and the initialization power supply line IPL. One end of the auxiliary connection line AUX may be connected to the fourth source electrode SE4 through a ninth contact hole CH9. The other end of the auxiliary connection line AUX may be connected to the initialization power supply line IPL in the (i–1)th row through an eighth contact hole CH8 of the first pixel PXL1 in the (i–1)th row. One end of the fourth drain electrode DE4 may be connected to the fourth active pattern ACT4. The other end of the fourth drain electrode DE4 may be connected to the third drain electrode DE3 of the third transistor T3. The fourth drain electrode DE4 may be connected to the first gate electrode GE1 of the first transistor T1 through the first connection line CNL1, the second contact hole CH2, and the first contact hole CH1.

The fifth transistor T5 may include a fifth gate electrode GE5, a fifth active pattern ACT5, a fifth source electrode SE5, and a fifth drain electrode DE5.

The fifth gate electrode GE5 may be connected to the first emission control line E1$i$. The fifth gate electrode GE5 may be provided as a portion of the first emission control line E1$i$, or extend from the first emission control line E1$i$. Each of the fifth active pattern ACT5, the fifth source electrode SE5, and the fifth drain electrode DE5 may include a semiconductor layer, and the semiconductor layer may or may not be doped with impurities. For example, the fifth source electrode SE5 and the fifth drain electrode DE5 may include a semiconductor layer that is doped with impurities. The fifth active pattern ACT5 may overlap with the fifth gate electrode GE5. One end of the fifth source electrode SE5 may be connected to the fifth active pattern ACT5. The other end of the fifth source electrode SE5 may be connected to the power supply line PL through a fifth contact hole CH5. One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode GE6 may be connected to the first emission control line E1$i$. The sixth gate electrode GE6 may be provided as a part of the first emission control line E1$i$ or extend from the first emission control line E1$i$. Each of the sixth active pattern ACT6, the sixth source electrode SE6, and the sixth drain electrode DE6 may include a semiconductor layer, and the semiconductor layer may or may not be doped with impurities. For example, the sixth source electrode SE6 and the sixth drain electrode DE6 may include a semiconductor layer that is doped with impurities, and the sixth active pattern ACT6 may include a semiconductor layer that is not doped with impurities. The sixth active pattern ACT6 may overlap with the sixth gate electrode GE6. One end of the sixth source electrode SE6 may be connected to the sixth active pattern ACT6. The other end of the sixth source electrode SE6 may be connected to the first drain electrode DE1 of the first transistor T1 and the third source electrode SE3 of the third transistor T3. The other end of the sixth drain electrode DE6 may be connected to a seventh source electrode SE7 of the seventh transistor T7.

The seventh transistor T7 may include a seventh gate electrode GE7, a seventh active pattern ACT7, the seventh source electrode SE7, and the seventh drain electrode DE7.

The seventh gate electrode GE7 may be connected to the lower i-th first scan line S1$i$. The seventh gate electrode GE7 may be provided as a portion of the lower i-th first scan line S1$i$ or extend from the lower i-th first scan line S1$i$. Each of the seventh active pattern ACT7, the seventh source electrode SE7, and the seventh drain electrode DE7 may include a semiconductor layer, and the semiconductor layer may or may not be doped with impurities. For example, the seventh source electrode SE7 and the seventh drain electrode DE7 may include a semiconductor layer that is doped with impurities, and the seventh active pattern ACT7 may include a semiconductor layer that is not doped with impurities. The seventh active pattern ACT7 may overlap with the seventh gate electrode GE7. One end of the seventh source electrode SE7 may be connected to the seventh active pattern ACT7. The other end of the seventh source electrode SE7 may be connected to the sixth drain electrode DE6 of the sixth transistor T6. One end of the seventh drain electrode DE7 may be connected to the seventh active pattern ACT7. The other end of the seventh drain electrode DE7 may be connected to the initialization power supply line IPL. The seventh drain electrode DE7 may be connected to the fourth source electrode SE4 of the fourth transistor T4 of the first pixel PXL1 arranged in an (i–1)th row. The seventh drain electrode DE7 and the fourth source electrode SE4 of the fourth transistor T4 of the first pixel PXL may be connected to each other through the auxiliary line AUX, the eighth contact hole CH8, and the ninth contact hole CH9.

The storage capacitor Cst may include a lower electrode LE and an upper electrode UE. The lower electrode LE may include the first gate electrode GE1 of the first transistor T1.

The upper electrode UE may overlap with the first gate electrode GE1 and cover the lower electrode LE as viewed in the plane. The capacitance of the storage capacitor Cst may be increased by increasing an overlapping area between the upper electrode UE and the lower electrode LE. The upper electrode UE may extend in the first direction DR1. According to one embodiment, a voltage having the same level as the first power supply may be applied to the upper electrode UE. The upper electrode UE may have an opening OPN at a position corresponding to the first contact hole CH1 where the first gate electrode GE1 and the first connection line CNL1 contact each other.

The organic light emitting diode OLED may include a first electrode AD, a second electrode CD, and an emitting layer EML that is provided between the first electrode AD and the second electrode CD.

The first electrode AD may be provided in an emission area corresponding to each pixel PXL1. The first electrode AD may be connected to the seventh source electrode SE7 of the seventh transistor T7 and the sixth drain electrode DE6 of the sixth transistor T6 through the seventh contact hole CH7 and the tenth contact hole CH10. A bridge pattern BRP may be provided between the seventh contact hole CH7 and the tenth contact hole CH10. The bridge pattern BRP may connect the sixth drain electrode DE6, the seventh source electrode SE7, and the first electrode AD.

Hereinafter, the structure of a display device according to one embodiment will be described according to a stacking order with reference to FIGS. 5 to 7.

The active patterns (ACT1 to ACT7; hereinafter, 'ACT') may be provided on the substrate SUB. The active pattern ACT may include the first to seventh active patterns ACT1 to ACT7. The first to seventh active patterns ACT1 to ACT7 may include a semiconductor material.

A buffer layer (not illustrated) may be provided between the substrate SUB and the first active pattern ACT1 to the seventh active pattern ACT7.

A gate insulating layer GI may be provided on the substrate SUB where the first active pattern ACT1 and the seventh active pattern ACT7 are provided.

The (i−1)th first scan line S1i−1, the i-th first scan line S1i, the emission control line E1i, the first gate electrode GE1, and the seventh gate electrode GE7 may be provided on the gate insulating layer GI. The first gate electrode GE1 may be the lower electrode LE of the storage capacitor Cst. The second gate electrode GE2 and the third gate electrode GE3 may be formed integrally with the upper i-th first scan line S1i. The fourth gate electrode GE4 may be formed integrally with the (i−1)th first scan line S1i−1. The fifth gate electrode GE5 and the sixth gate electrode GE6 may be formed integrally with the emission control line E1i. The seventh gate electrode GE7 may be formed integrally with the lower i-th first scan line S1i.

A first interlayer insulating layer IL1 may be provided on the substrate SUB on which the (i−1)th first scan line S1i−1 is formed.

The upper electrode UE of the storage capacitor Cst and the initialization power supply line IPL may be provided on the first interlayer insulating layer IL1 The upper electrode UE of the storage capacitor Cst may cover the lower electrode LE of the storage capacitor Cst. The upper electrode UE and the lower electrode LE may form the storage capacitor Cst with the first interlayer insulating layer IL1 that is interposed therebetween.

A second interlayer insulating layer IL2 may be provided on the substrate SUB on which the upper electrode UE of the storage capacitor Cst and the initialization power supply line IPL are arranged.

The data line Dj, the power supply line PL, the first connection line CNL1, the auxiliary connection line AUX, and the bridge pattern BRP may be provided on the second interlayer insulating layer IL2.

The data line Dj may be connected to the second source electrode SE2 through the sixth contact hole CH6 passing through the second interlayer insulating layer IL2, the first interlayer insulating layer ILL and the gate insulating layer GI.

The power supply line PL may be connected to the upper electrode UE of the storage capacitor Cst through the third and fourth contact holes CH3 and CH4 passing through the second interlayer insulating layer IL2. The power supply line PL may be connected to the fifth source electrode SE5 through the fifth contact hole CH5 passing through the second interlayer insulating layer IL2, the first interlayer insulating layer IL1, and the gate insulating layer GI.

The first connection line CNL1 may be connected to the first gate electrode GE1 through the first contact hole CH1 passing through the second interlayer insulating layer IL2 and the first interlayer insulating layer ILL In addition, the first connection line CNL1 may be connected to the third drain electrode DE3 and the fourth drain electrode DE4 through the second contact hole CH2 passing through the second interlayer insulating layer IL2, the first interlayer insulating layer IL1, and the gate insulating layer GI.

The auxiliary connection line AUX may be connected to the initialization power supply line IPL through the eighth contact hole CH8 passing through the second interlayer insulating layer IL2. In addition, the auxiliary connection line AUX may be connected to the fourth source electrode SE4 through the ninth contact hole CH9 passing through the second interlayer insulating layer IL2, the first interlayer insulating layer IL1, and the gate insulating layer GI.

The bridge pattern BRP may be provided between the sixth drain electrode DE6 and the first electrode AD and serve as a medium for connecting the sixth drain electrode DE6 and the first electrode AD. The bridge pattern BRP may be connected to the sixth drain electrode DE6 and the seventh source electrode SE7 through the seventh contact hole CH7 passing through the second interlayer insulating layer IL2, the first interlayer insulating layer IL1, and the gate insulating layer GI.

A passivation layer PSV may be provided on the substrate SUB on which the data line Dj is arranged.

The organic light emitting diode OLED may be provided on the passivation layer PSV. The organic light emitting diode OLED may include the first electrode AD, the second electrode CD, and the emitting layer EML that is provided between the first electrode AD and the second electrode CD.

The first electrode AD may be provided on the passivation layer PSV. The first electrode AD may be connected to the bridge pattern BRP through the tenth contact hole CH10 passing through the passivation layer PSV. Since the bridge pattern BRP is connected to the sixth drain electrode DE6 and the seventh source electrode SE7 through the seventh contact hole CH7, the first electrode AD may be connected to the sixth drain electrode DE6 and the seventh source electrode SE7.

A pixel defining layer PDL dividing the pixel area so as to correspond to each pixel PXL may be provided on the substrate SUB on which the first electrode AD is disposed. The pixel defining layer PDL may expose the top surface of the first electrode AD and protrude from the substrate SUB along the circumference of each pixel PXL.

The emitting layer EML may be provided in the pixel area surrounded by the pixel defining layer PDL, and the second electrode CD may be provided on the emitting layer EML. A sealing layer SLM covering the second electrode CD may be provided on the second electrode CD.

One of the first electrode AD and the second electrode CD may be an anode electrode, and the other may be a cathode electrode. For example, the first electrode AD may be an anode electrode, and the second electrode CD may be a cathode electrode.

In addition, at least one of the first electrode AD and the second electrode CD may be a transmissive electrode. For example, when the light emitting device (OLED) is a bottom emission type organic light emitting display device, the first electrode AD may be a transmissive electrode, and the second electrode CD may be a reflective electrode. When the light emitting device (OLED) is a top emission type organic light emitting display device, the first electrode AD is a reflective electrode, and the second electrode CD is a transmissive electrode. When the light emitting device (OLED) is a dual type emission organic light emitting display device, both the first electrode AD and the second electrode CD may be transmissive electrodes. For convenience of explanation, an example in which the light emitting device (OLED) is a top emission type organic light emitting display device, and the first electrode AD is an anode electrode is described.

The first electrode AD may include a reflective layer (not illustrated) reflecting light and a transparent conductive layer (not illustrated) provided under or above the reflective layer. At least one of the transparent conductive layer and the reflective layer may be connected to the sixth drain electrode DE6 and the seventh source electrode SE7.

The reflective layer may include a material capable of reflecting light. For example, the reflective layer may include at least one of aluminum (Al), silver (Ag), chromium (Cr), molybdenum (Mo), platinum (Pt), nickel (Ni), and an alloy thereof.

The transparent conductive layer may include a transparent conductive oxide. For example, the transparent conductive layer may include at least one of the transparent conductive oxides including indium tin oxide (ITO), indium zinc oxide (IZO), aluminum zinc oxide (AZO), Gallium doped zinc oxide (GZO), zinc tin oxide (ZTO), Gallium tin oxide (GTO), and fluorine doped tin oxide (FTO).

The pixel defining layer PDL may include an organic insulating material. For example, the pixel defining layer PDL may include at least one of polystyrene, polymethylmethacrylate (PMMA,), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The emitting layer EML may be disposed on the exposed surface of the first electrode AD. The emitting layer EML may have a multilayer thin film structure including at least a light generation layer LGL. For example, the emitting layer EML may include a hole injection layer HIL for injecting holes, a hole transport layer HTL, the light generation layer LGL, a hole blocking layer HBL, an electron transport layer ETL, and an electron injection layer EIL for injecting electrons. The hole transport layer HTL may have excellent hole transportability and block movements of electrons that fail to be combined in the light generation layer LGL so as to increase the chances of recombination between the holes and the electrons. The light generation layer LGL may generate light by recombination between the injected electrons and holes. The hole blocking layer HBL may block movements of the holes that fail to be combined in the light generation layer LGL. The electron transport layer ETL may be formed to smoothly transport the electrons to the light generation layer LGL.

Light generated from the light generation layer LGL may be of one of red, green, blue, and white. However, the present disclosure is not limited thereto. For example, light generated from the light generation layer of the emitting layer EML may be of one of magenta, cyan, and yellow.

The hole injection layer HIL, the hole transport layer HTL, the hole blocking layer HBL, the electron transport layer ETL and the hole injection layer HIL may be common layers connected to each other in adjacent emission areas.

The second electrode CD may be a transflective layer. For example, the second electrode CD may be a thin metal layer that has enough thickness to transmit light emitted from the emitting layer EML. The second electrode CD may transmit a portion of light emitted from the emitting layer EML and reflect the remaining portion of light emitted from the emitting layer EML.

The second electrode CD may include a material having a lower work function than the transparent conductive layer. For example, the second electrode CD may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Jr), chromium (Cr), lithium (Li), calcium (Ca), and an alloy thereof.

A portion of light emitted from the emitting layer EML may not penetrate the second electrode CD, and light reflected from the second electrode CD may be reflected again from the first electrode AD. In other words, light emitted from the emitting layer EML may resonate between the first electrode AD and the second electrode CD. The resonance of light may improve light extraction efficiency of the display device (OLED).

The sealing layer SLM may prevent ingress of oxygen and moisture into the light emitting device (OLED). The sealing layer SLM may include an inorganic layer (not illustrated). The inorganic layer may include at least one of silicon oxide, silicon nitride, silicon oxynitride, aluminum oxide, titanium oxide, zirconium oxide, and tin oxide. The sealing layer SLM may cover the pixel area PXA of each of the first, second, and third areas A1 to A3 as shown in FIG. 3 and extend outward from the pixel area PXA.

Insulating layers including an organic material may be advantageous in terms of flexibility and elasticity. However, ingress of moisture or oxygen may be more likely to occur than insulating layers including an inorganic material. According to one embodiment, to prevent ingress of moisture or oxygen through the insulating layers including the organic material, end portions of the insulating layers including the organic material may be covered by the insulating layers including the inorganic material and keep the insulating layers including the organic material from being exposed. For example, the passivation layer PSV and the pixel defining layer PDL including the organic material may extend to a portion of the peripheral area PPA as shown in FIG. 1 of each of the first, second, and third areas A1 to A3 as shown in FIG. 1 and may not cover the entire peripheral area PPA. The passivation layer PSV and the pixel defining layer PDL including the organic material may have a valley (not illustrated) formed by removing a portion thereof along the circumference of the pixel area PXA. The passivation layer PSV, the pixel defining layer PDL, and the valley are described below.

According to one embodiment, the second pixel PXL2 provided in the second pixel area PXA2 and the third pixel PXL3 provided in the third pixel area PXA3 may have substantially the same pixel structure as the first pixel PXL1. Thus, a detailed description thereof will be omitted.

Figure 8:
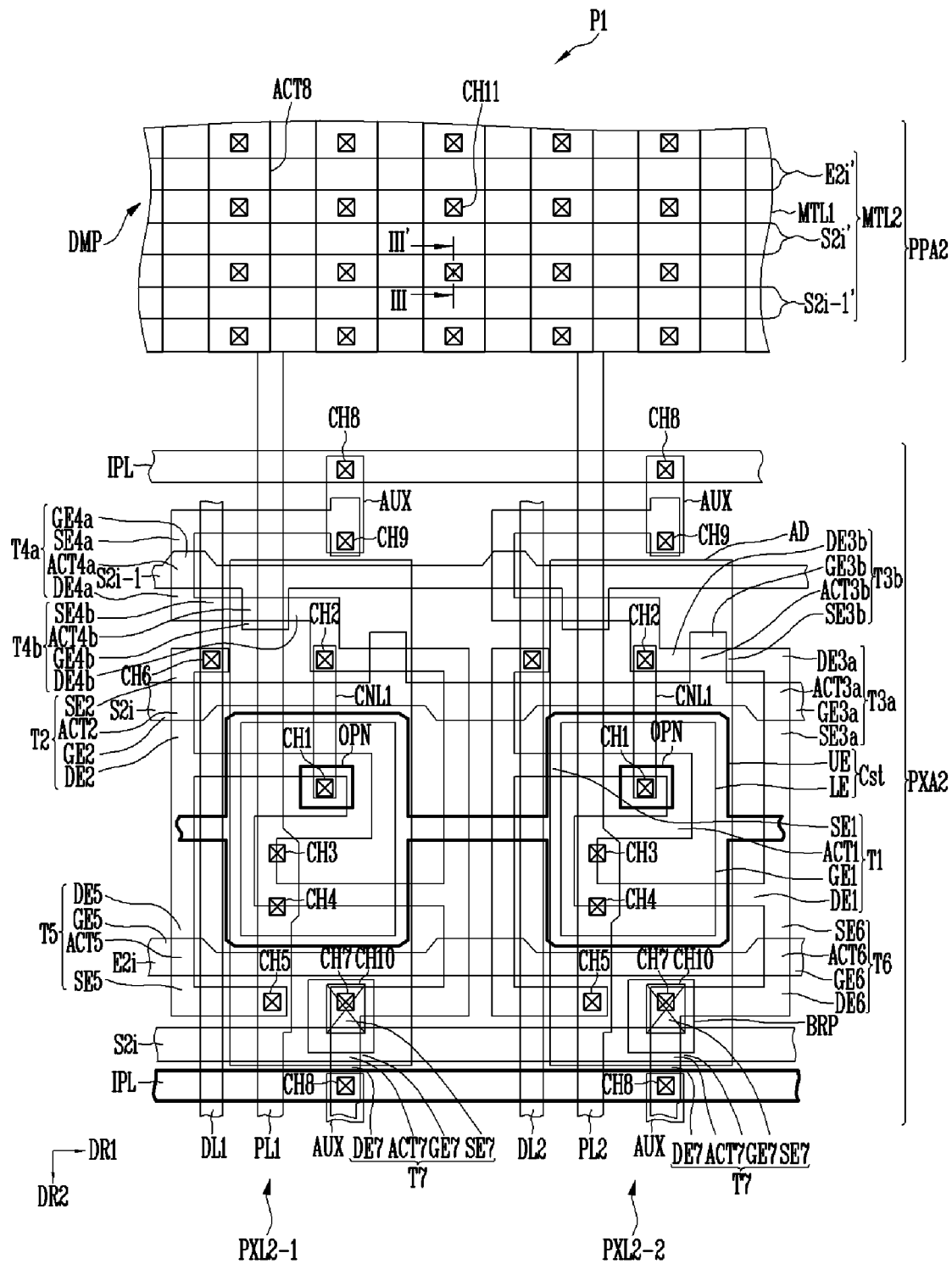
FIG. 8 is a plan view illustrating a portion corresponding to P1 of FIG. 1.
Figure 9:
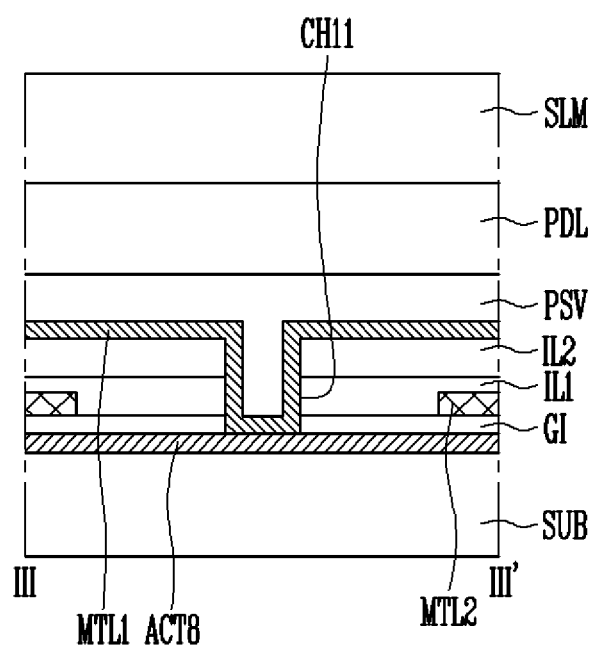
FIG. 9 is a cross-sectional view taken along line III-III' of FIG. 8.

FIG. 8 is a plan view illustrating a portion corresponding to P1 of FIG. 1, and FIG. 9 is a cross-sectional view taken along line III-III' of FIG. 8. FIGS. 8 and 9 illustrate two second scan lines S2$i$–1 and S2$i$, a second emission control line E2$i$, and two second data lines Dj and Dj+1 connected to second pixels PXL2-1 and PXL2-2 on the basis of the (2–1)th pixel PXL2-1 arranged in an i-th row and a j-th column of the second pixel area PXA2 and the (2–2)th pixel PXL2-2 arranged in the i-th row and a (j+1)th column. The two second pixels PXL2-1 and PXL2-2 may be arranged closest to the dummy part DMP.

In addition, for convenience of explanation, FIGS. 8 and 9 illustrate two adjacent second pixels PXL2-1 and PXL2-2 and a portion of the dummy part DMP arranged in the same column as the two adjacent second pixels PXL2-1 and PXL2-2. In addition, for convenience of explanation, in FIGS. 8 and 9, a second scan line in the (i−1)th row may be referred to as an "(i−1)th second scan line S2i−1", a second scan line in the i-th row may be referred to as an "i-th second scan line S2i", an emission control line in the i-th row may be referred to as an "emission control line E2i", a data line in the j-th column may be referred to as a "first data line DL1", a data line in a (j+1)th column may be referred to as a "second data line DL2", a power supply line in the j-th column may be referred to as a "first power supply line PL1", and a power supply line in the (j+1)th column may be referred to as a "second power supply line PL2."

Referring to FIGS. 1, 8, and 9, a display device according to one embodiment may have a structure in which each of the pixel areas PXA has a different parasitic capacitance by using the dummy part DMP in order to compensate for the difference in a load value between the respective pixel areas PXA. To compensate for the difference in the load value between the scan lines in the first pixel area PXA1, the second pixel area PXA2 and the third pixel area PXA3, the dummy part DMP may not be provided in the first peripheral area PPA1 corresponding to the first pixel area PXA1, whereas the dummy part DMP may be provided in the second peripheral area PPA2 corresponding to the second pixel area PXA2 and the third peripheral area PPA3 corresponding to the third pixel area PXA3. In addition, although not shown in FIGS. 1, 8, and 9, the dummy part DMP may also be provided in the additional peripheral area APA.

The display device according to one embodiment may include the substrate SUB, the line part, and the second pixels PXL2-1 and PXL2-2. In addition, the line part may include the second scan lines S2i−1 and S2i, the first and second data lines DL1 and DL2, the emission control line E2i, the power supply lines PL1 and PL2, and the initialization power supply line IPL for supplying signals to the second pixels PXL2-1 and PXL2-2.

The second scan lines S2i−1 and S2i may be provided in the second pixel area PXA2 and supply scan signals to the second pixels PXL2-1 and PXL2-2. The second scan lines S2i−1 and S2i may have different lengths from the first scan lines S1l to S1n that are provided in the first pixel area PXA1 as shown in FIG. 3. More specifically, the second scan lines S2i−1 and S2i may have shorter lengths than the first scan lines S11 to S1n.

The second scan lines S2i−1 and S2i may extend in the first direction DR1. The second scan lines S2i−1 and S2i may include the (i−1)th second scan line S2i−1 and the i-th second scan line S2i that are sequentially arranged in the second direction DR2 that crosses the first direction DR1. The second scan lines S2i−1 and S2i may receive scan signals. The i-th second scan line S2i may be branched into two lines that may be connected to different transistors. For example, the i-th second scan line S2i may include an upper i-th second scan line S2i that is adjacent to the (i−1)th second scan line S2i−1 and a lower i-th second scan line S2i that is distant from the (i−1)th second scan line S2i−1 than the i-th second scan line S2i.

The emission control line E2i may extend in the first direction DR1. The emission control line E2i may be arranged to be spaced apart from the i-th second scan line S2i between the two upper and lower i-th second scan lines S2i. The emission control line E2i may receive an emission control signal.

The second scan lines S2i−1 and S2i and the emission control line E2i may extend to the second peripheral area PPA2 and/or the additional peripheral area APA. More specifically, the second scan lines S2i−1 and S2i provided in the second pixel area PXA2 may extend to the second peripheral area PPA2 surrounding the second pixel area PXA2. In addition, the emission control line E2i provided in the second pixel area PXA2 may extend to the second peripheral area PPA2.

Hereinafter, for convenience of explanation, the second scan lines S2i−1 and S2i extending from the second pixel area PXA2 to the second peripheral area PPA2 may be referred to as "second scan line extension portions S2i−1' and S2i'". In addition, the emission control line E2i extending from the second pixel area PXA2 to the second peripheral area PPA2 may be referred to as an "emission control line extension portion E2i'".

The second pixels PXL2-1 and PXL2-2 may include a (2-1)th pixel PXL2-1 that is arranged in the i-th second scan line S2i and the first data line DL1, and a (2-2)th pixel PXL2-2 that is arranged in the i-th second scan line S2i and the second data line DL2. Each of the (2-1)th pixel PXL2-1 and the (2-2)th pixel PXL2-2 may include an organic light emitting device, the first to seventh transistors T1 to T7, and the storage capacitor Cst.

The first transistor T1 may include the first gate electrode GE1, the first active pattern ACT1, the first source electrode SE1, the first drain electrode DE1, and the first connection line CNL1. The second transistor T2 may include the second gate electrode GE2, the second active pattern ACT2, the second source electrode SE2, and the second drain electrode DE2. The third transistor T3 may include the third gate electrode GE3, the third active pattern ACT3, the third source electrode SE3, and the third drain electrode DE3. The fourth transistor T4 may include the fourth gate electrode GE4, the fourth active pattern ACT4, the fourth source electrode SE4, and the fourth drain electrode DE4. The fifth transistor T5 may include the fifth gate electrode GE5, the fifth active pattern ACT5, the fifth source electrode SE5, and the fifth drain electrode DE5. The sixth transistor T6 may include the sixth gate electrode GE6, the sixth active pattern ACT6, the sixth source electrode SE6, and the sixth drain electrode DE6. The seventh transistor T7 may include the seventh gate electrode GE7, the seventh active pattern ACT7, the seventh source electrode SE7, and the seventh drain electrode DE7.

The substrate SUB may include the second pixel area PXA2 where the second pixels PXL2-1 and PXL2-2 are provided and the second peripheral area PPA2 surrounding the second pixel area PXA2. The dummy part DMP for compensating for the difference in a load value between the pixel areas PXA may be provided in the second peripheral area PPA2.

The dummy part DMP may include an eighth active pattern ACT8, a second metal layer MTL2, and a first metal layer MTL1.

The eighth active pattern ACT8 may be provided on the same layer as the first active to seventh active patterns ACT1 to ACT7 that are provided on the second pixels PXL2-1 and PXL2-2. The eighth active pattern ACT8 may include a semiconductor layer, and the semiconductor layer may or may not be doped with impurities. The eighth active pattern ACT8 may have a bar shape extending in the second direction DR2 and be arranged in the first direction DR1. However, the present disclosure is not limited thereto. As viewed in the plane, the eighth active pattern ACT8 may partially overlap with the second metal layer MTL2.

The second metal layer MTL2 may include the second scan line extension portions S2i−1' and S2i' extending from the second pixel area PXA2 to the second peripheral area PPA2 and the emission control line extension portion E2$i'$ extending from the second pixel area PXA2 to the second peripheral area PPA2. The second metal layer MTL2 may be provided on the same layer as the second scan lines S2$i$–1 and S2$i$ and the emission control line E2$i$ that are provided in the second pixel area PXA2.

The first metal layer MTL1 may overlap with the eighth active pattern ACT8 and the second metal layer MTL2 while interposing the insulating layers GI, IL1, and IL2, and cover a portion or entirety of the second peripheral area PPA2.

The first metal layer MTL1 may extend from the power supply lines PL1 and PL2 that are connected to the second pixels PXL2-1 and PXL2-2 and arranged closest to the dummy part DMP. However, the present disclosure is not limited thereto. For example, as shown in FIG. 1, the first metal layer MTL1 may be formed integrally with the first power supply line ELVDD surrounding the second peripheral area PPA2 and overlapping with the overlapping dummy part DMP. The first metal layer MTL1 may be electrically connected to the power supply lines PL1 and PL2 that are connected to the second pixels PXL2-1 and PXL2-2.

The first metal layer MTL1 may be provided on the same layer as the data lines D1 and D2 and the power supply lines PL1 and PL2. According to one embodiment, the first metal layer MTL1 may be formed integrally with the power supply lines PL1 and PL2 so that a fixed voltage applied to each of the first power supply line PL1 and the second power supply line PL2 may also be applied to the first metal layer MTL1. The fixed voltage may be the first power supplied to the first power supply line ELVDD. The first metal layer MTL1 may overlap with the second metal layer MTL2 to form a parasitic capacitor. In addition, the second metal layer MTL2 may overlap with the eighth active pattern ACT8 and the gate insulating layer GI, among the insulating layers (GI, IL1, and IL2), therebetween so as to form a parasitic capacitor.

The first metal layer MTL1 may be connected to the eighth active pattern ACT8 through an eleventh contact hole CH11. The eleventh contact hole CH11 may be arranged in an overlapping area between the eighth active pattern ACT8 and the first metal layer MTL1. More specifically, the eleventh contact hole CH11 may be arranged in an area where the second metal layer MTL2 is not provided, and the eighth active pattern ACT8 and the first metal layer MTL1 overlap with each other.

The dummy part DMP may include at least one eleventh contact hole CH11. However, the present disclosure is not limited thereto. For example, the dummy part DMP may include the same or less number of eleventh contact holes CH11 as the number of contact holes CH1 to CH10 provided in the second pixels PXL2-1 and PXL2-2. The second pixels PXL2-1 and PXL2-2 may be arranged closest to the dummy part DMP in the second direction DR2 in the second pixel area PXA2.

By arranging the dummy part DMP and the eleventh contact hole CH11 in the dummy part DMP, the elements arranged in the second pixels PXL2-1 and PXL2-2 arranged closest to the dummy part DMP, for example, lines, active patterns, and contact holes, may have a similar density to those arranged in the dummy part DMP.

In general, the density of the elements disposed in the dummy part DMP may be lower than the density of the elements disposed in the second pixels PXL2-1 and PXL2-2 that are closest to the dummy part DMP. As a result, a difference in uniformity may occur between the second peripheral area PPA2 where the dummy part DMP is disposed and the second pixel area PXA2 where the second pixels PXL2-1 and PXL2-2 that are closest to the dummy part DMP are disposed.

When the second peripheral area PPA2 and the second pixel area PXA2 have different degrees of uniformity, the second pixels PXL2-1 and PXL2-2 may not be desirably designed during processes using a mask. As a result, the second pixels PXL2-1 and PXL2-2 that are arranged closest to the dummy part DMP may have a different size from the remaining second pixels PXL2 that are adjacent to the second pixels PXL2-1 and PXL2-2 in the second direction DR2. Thus, the second pixels PXL2 may have different sizes depending on their position, a difference in visibility may occur, and the uniformity of the second pixel area PXA2 may be deteriorated.

According to one embodiment, by arranging at least one eleventh contact hole CH11 in the dummy part DMP, the density of the elements in the second pixels PXL2-1 and PXL2-2 that are arranged closest to the dummy part DMP may be made to be similar to the density of the elements in the dummy part DMP.

In the dummy part DMP, the second metal layer MTL2 and the first metal layer MTL1 may overlap with each other while interposing the first and second interlayer insulating layers IL1 and IL2, among the insulating layers GI, IL1, and IL2, thereby forming the parasitic capacitor. In addition, in the dummy part DMP, the eighth active pattern ACT8 and the second metal layer MTL2 may overlap with each other with the gate insulating layer GI that is interposed therebetween to form the parasitic capacitor. The parasitic capacitance of the parasitic capacitor may increase load values of the second scan lines S2$i$–1 and S2$i$ and/or the emission control line E2$i$ that are provided in the second pixel area PXA2. As a result, the load values of the second scan lines S2$i$–1 and S2$i$ may be the same as or similar to load values of the first scan lines of the first pixel area PXA1.

According to one embodiment, the parasitic capacitance formed by the dummy part DMP may vary depending on load values of scan lines and/or emission control lines to compensate for a difference.

According to one embodiment, the dummy part DMP and the eleventh contact hole CH11 that is disposed in the dummy part DMP may be provided in the third peripheral area PPA3 in the same configuration as the second peripheral area PPA2. Therefore, a description of the third peripheral area PPA3 will be omitted.

Hereinafter, the structure of the dummy part DMP is described according to a stacking order with reference to FIG. 9.

The eighth active pattern ACT8 may be provided on the substrate SUB. The eighth active pattern ACT8 may include a semiconductor material.

The gate insulating layer GI may be provided on the substrate SUB where the eighth active pattern ACT8 is provided.

The second metal layer MTL2 may be provided on the gate insulating layer GI. The second metal layer MTL2 may overlap with the eighth active pattern ACT8 while interposing the gate insulating layer GI to form the parasitic capacitor.

The first interlayer insulating layer IL1 and the second interlayer insulating layer IL2 may be sequentially provided on the second metal layer MTL2. The eleventh contact hole CH11 may be formed through the second interlayer insulating layer IL2, the first interlayer insulating layer IL1, and the gate insulating layer GI.

The first metal layer MTL1 may be provided on the second interlayer insulating layer IL2 including the eleventh contact hole CH11. The first metal layer MTL1 may be coupled to the eighth active pattern ACT8 through the eleventh contact hole CH11. The first metal layer MTL1 may overlap with the second metal layer MTL2 while interposing the first and second interlayer insulating layers IL1 and IL2 to form the parasitic capacitor.

The passivation layer PSV may be provided on the substrate SUB on which the first metal layer MTL1 is formed. The pixel defining layer PDL may be provided on the substrate SUB on which the passivation layer PSV is formed. Each of the passivation layer PSV and the pixel defining layer PDL may be an organic insulating layer including an organic material.

The sealing layer SLM covering the pixel defining layer PDL may be provided on the pixel defining layer PDL.

FIGS. 10 to 13 are schematic layout views illustrating layers of elements of a second pixel and a dummy part shown in FIG. 8.

Figure 10:
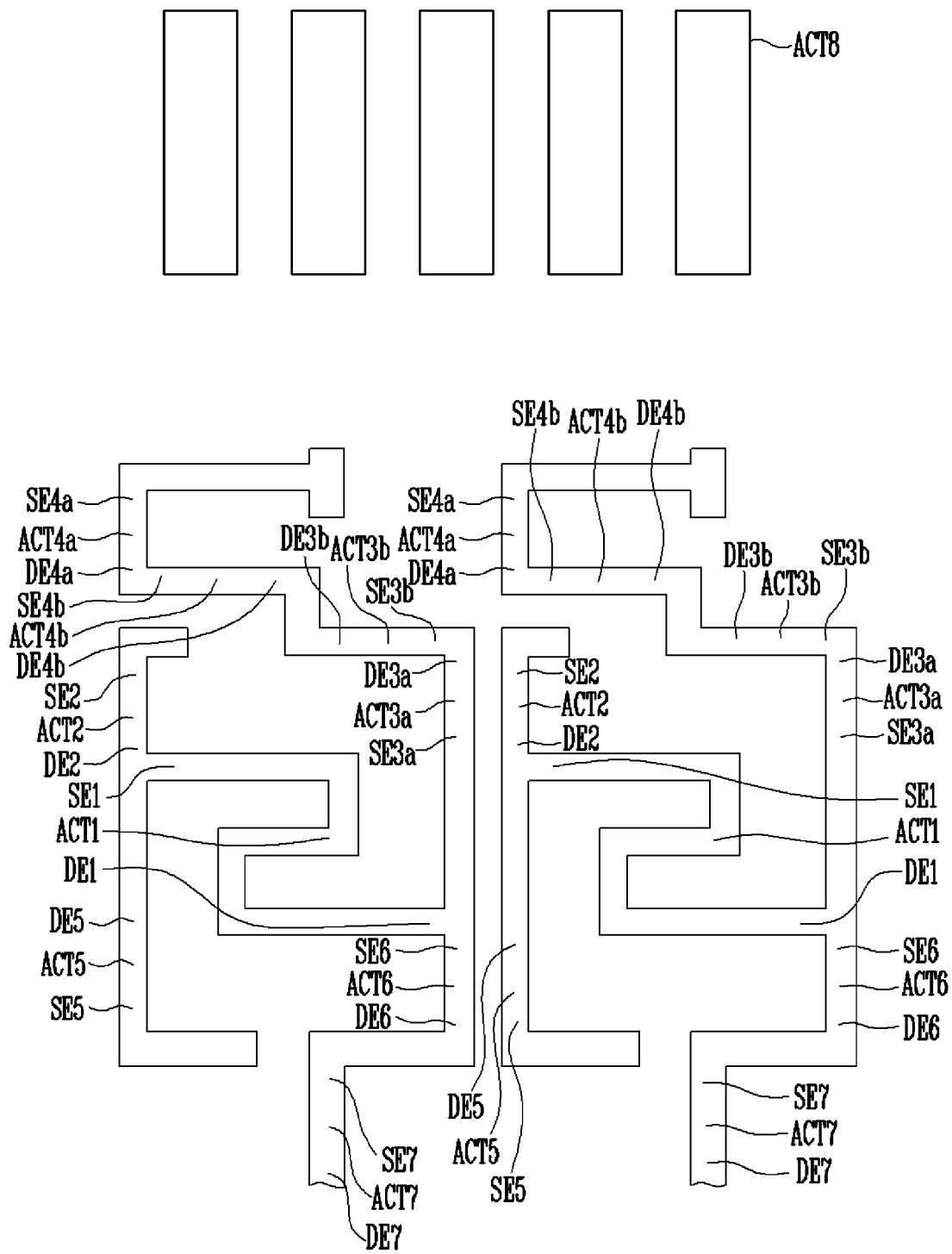
FIGS. 10 to 13 are schematic layout views illustrating layers of elements of a second pixel and a dummy part shown in FIG. 8.

First, referring to FIGS. 8 and 10, the first to eighth active patterns ACT1 to ACT8 may be provided on the substrate SUB as shown in FIG. 9. The first to eighth active patterns ACT1 to ACT8 may be provided on the same layer and formed by the same processes.

One end of the first active pattern ACT1 may be connected to the first source electrode SE1 and the other end of the first active pattern ACT1 may be connected to the first drain electrode DEL One end of the second active pattern ACT2 may be connected to the second source electrode SE2 and the other end of the second active pattern ACT2 may be connected to the second drain electrode DE2. One end of the third active pattern ACT3 may be connected to the third source electrode SE3 and the other end of the third active pattern ACT3 may be connected to the third drain electrode DE3. One end of the fourth active pattern ACT4 may be connected to the fourth source electrode SE4, and the other end of the fourth active pattern ACT4 may be connected to the fourth drain electrode DE4. One end of the fifth active pattern ACT5 may be connected to the fifth source electrode SE5, and the other end of the fifth active pattern ACT5 may be connected to the fifth drain electrode DE5. One end of the sixth active pattern ACT6 may be connected to the sixth source electrode SE6, and the other end of the sixth active pattern ACT6 may be connected to the sixth drain electrode DE6. One end of the seventh active pattern ACT7 may be connected to the seventh source electrode SE7, and the other end of the seventh active pattern ACT7 may be connected to the seventh drain electrode DE7.

Figure 11:
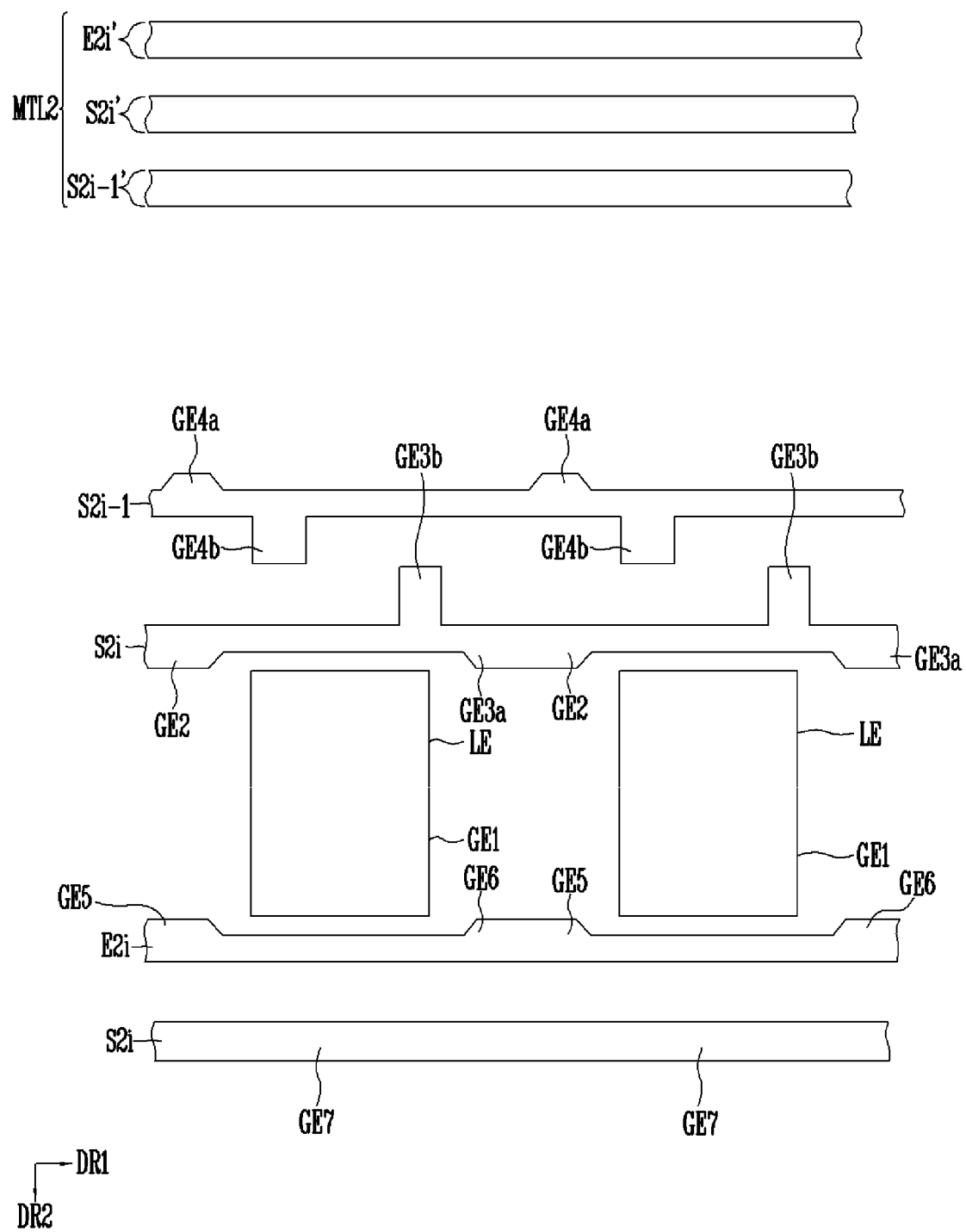

Referring to FIGS. 8 and 11, the second scan lines S2$i$-1 and S2$i$, the emission control line E2$i$, the lower electrode LE, and the second metal layer MTL2 may be provided on the first to eighth active patterns ACT1 to ACT8 with the gate insulating layer GI being interposed as shown in FIG. 9. The second scan lines S2$i$-1 and S2$i$, the emission control line E2$i$, the lower electrode LE, and the second metal layer MTL2 may be provided on the same layer and formed by the same processes.

The second scan lines S2$i$-1 and S2$i$ may include the (i-1)th second scan line S2$i$-1 and the i-th second scan line S2$i$. The i-th second scan line S2$i$ may be branched into two lines. For example, the i-th second scan line S2$i$ may include a lower i-th second scan line S2$i$ and an upper i-th second scan line S2$i$.

The first gate electrode GE1 may be provided on the lower electrode LE, and the fourth gate electrode GE4 may be provided on the (i-1)th second scan line S2$i$-1. The second gate electrode GE2 and the third gate electrode GE3 may be provided on the upper i-th second scan line S2$i$. The fifth gate electrode GE5 and the sixth gate electrode GE6 may be provided on the second emission control line E2$i$. The seventh gate electrode GE7 may be provided on the lower i-th second scan line S2$i$.

The second metal layer MTL2 may include an (i-1)th second scan line extension portion S2$i$-1' in which the (i-1)th second scan line S2$i$-1 extends to the second peripheral area PPA2, an i-th second scan line extension portion S2$i$' in which the i-th second scan line S2$i$ extends to the second peripheral area PPA2, and an i-th emission control line extension portion E2$i$' in which the second emission control line E2$i$ extends to the second peripheral area PPA2.

Figure 12:
Figure 12:
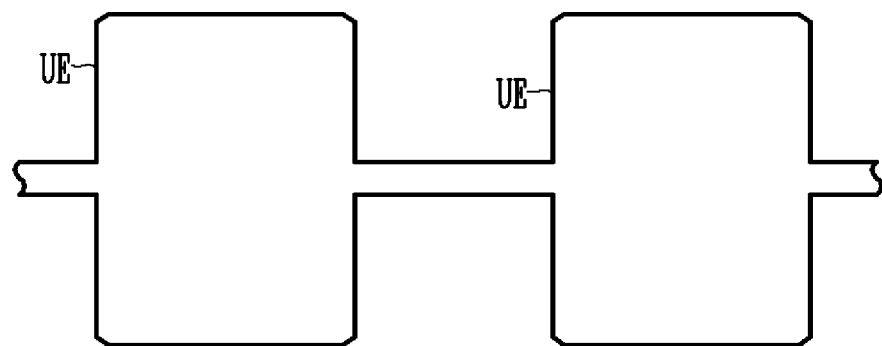
Figure 12:
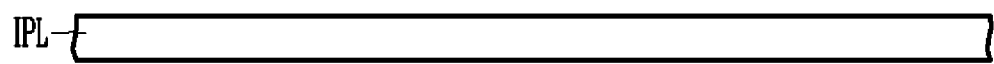

Referring to FIGS. 8 and 12, the initialization power supply line IPL and the upper electrode UE may be provided on the second scan lines S2$i$-1 and S2$i$, the emission control line E2$i$, the lower electrode LE, and the second metal layer MTL2 with the first interlayer insulating layer IL1 being interposed as shown in FIG. 9. The initialization power supply line IPL and the upper electrode UE may be provided on the same layer and formed by the same processes.

Figure 13:
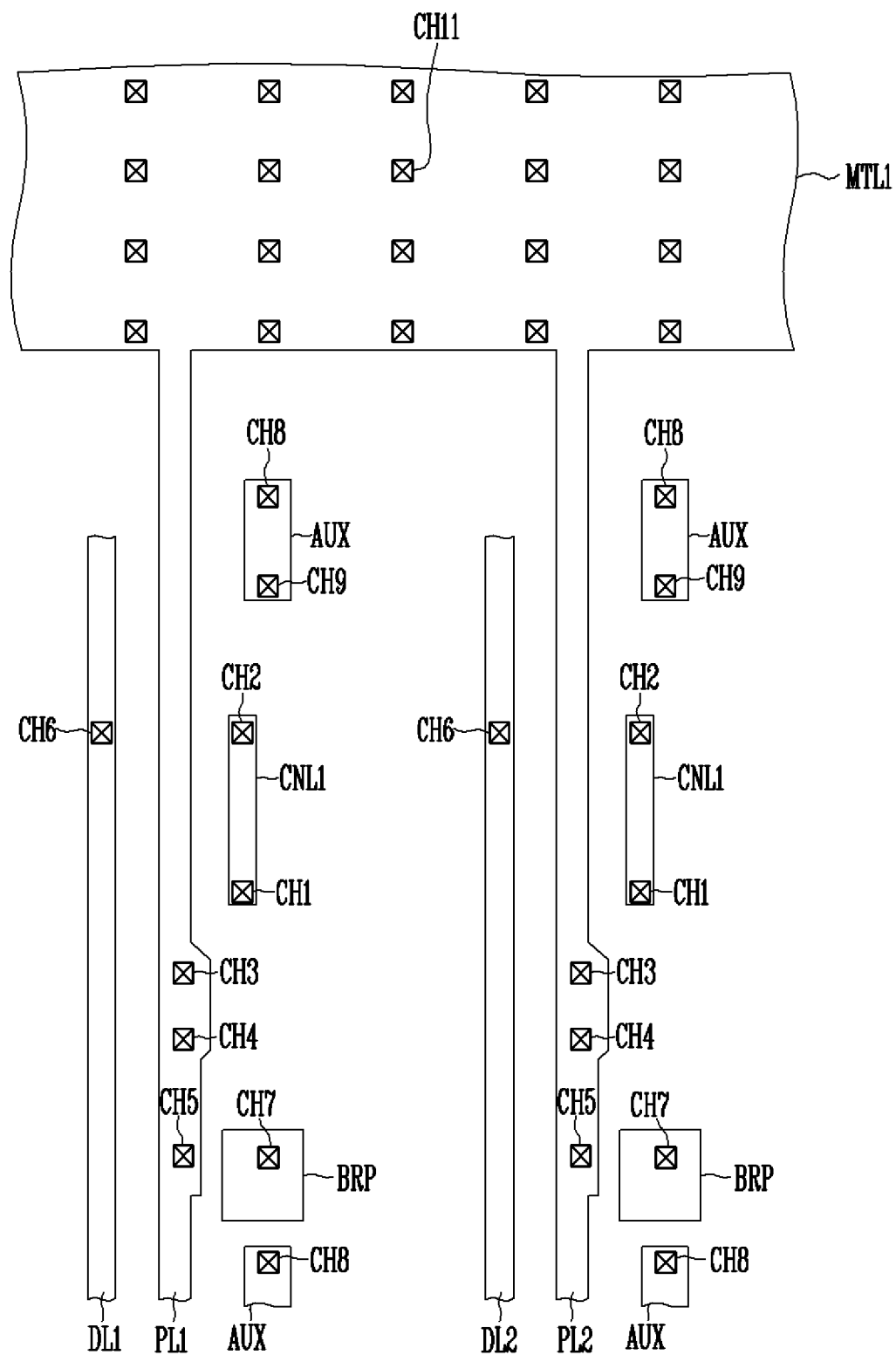

Referring to FIGS. 8 and 13, the first and second data lines DL1 and DL2, the power supply lines PL1 and PL2, the auxiliary connection line AUX, the first connection line CNL1, the bridge pattern BRP, and the first metal layer MTL1 may be provided on the initialization power supply line IPL and the upper electrode UE with the second interlayer insulating layer IL2 being interposed as shown in FIG. 9.

The first and second data lines DL1 and DL2 may be connected to the second source electrode SE2 through the sixth contact hole CH6 that is formed through the second interlayer insulating layer IL2, the first interlayer insulating layer IL1, and the gate insulating layer GI.

The power supply lines PL1 and PL2 may be connected to the upper electrode UE through the third and fourth contact holes CH3 and CH4 that are formed through the second interlayer insulating layer IL2. In addition, the power supply lines PL1 and PL2 may be connected to the fifth source electrode SE5 through the fifth contact hole CH5 that is formed through the second interlayer insulating layer IL2, the first interlayer insulating layer IL1, and the gate insulating layer GI.

The first connection line CNL1 may be connected to the first gate electrode GE1 through the first contact hole CH1 that is formed through the second interlayer insulating layer IL2 and the first interlayer insulating layer ILL In addition, the first connection line CNL1 may be connected to the third drain electrode DE3 and the fourth drain electrode DE4 through the second contact hole CH2.

The auxiliary connection line AUX may be connected to the initialization power supply line IPL through the eighth contact hole CH8 passing through the second interlayer insulating layer IL2. In addition, the auxiliary connection line AUX may be connected to the seventh drain electrode DE7 through the ninth contact hole CH9 passing through the second interlayer insulating layer IL2, the first interlayer insulating layer IL1, and the gate insulating layer GI.

The bridge pattern BRP may be connected to the sixth drain electrode DE6 and the seventh source electrode SE7 through the seventh contact hole CH7 that is formed through the second interlayer insulating layer IL2, the first interlayer insulating layer IL1, and the gate insulating layer GI.

The first metal layer MTL1 may be connected to the eighth active pattern ACT8 through the eleventh contact hole CH11 that is formed through the second interlayer insulating layer IL2, the first interlayer insulating layer IL1, and the gate insulating layer GI.

Figure 14:
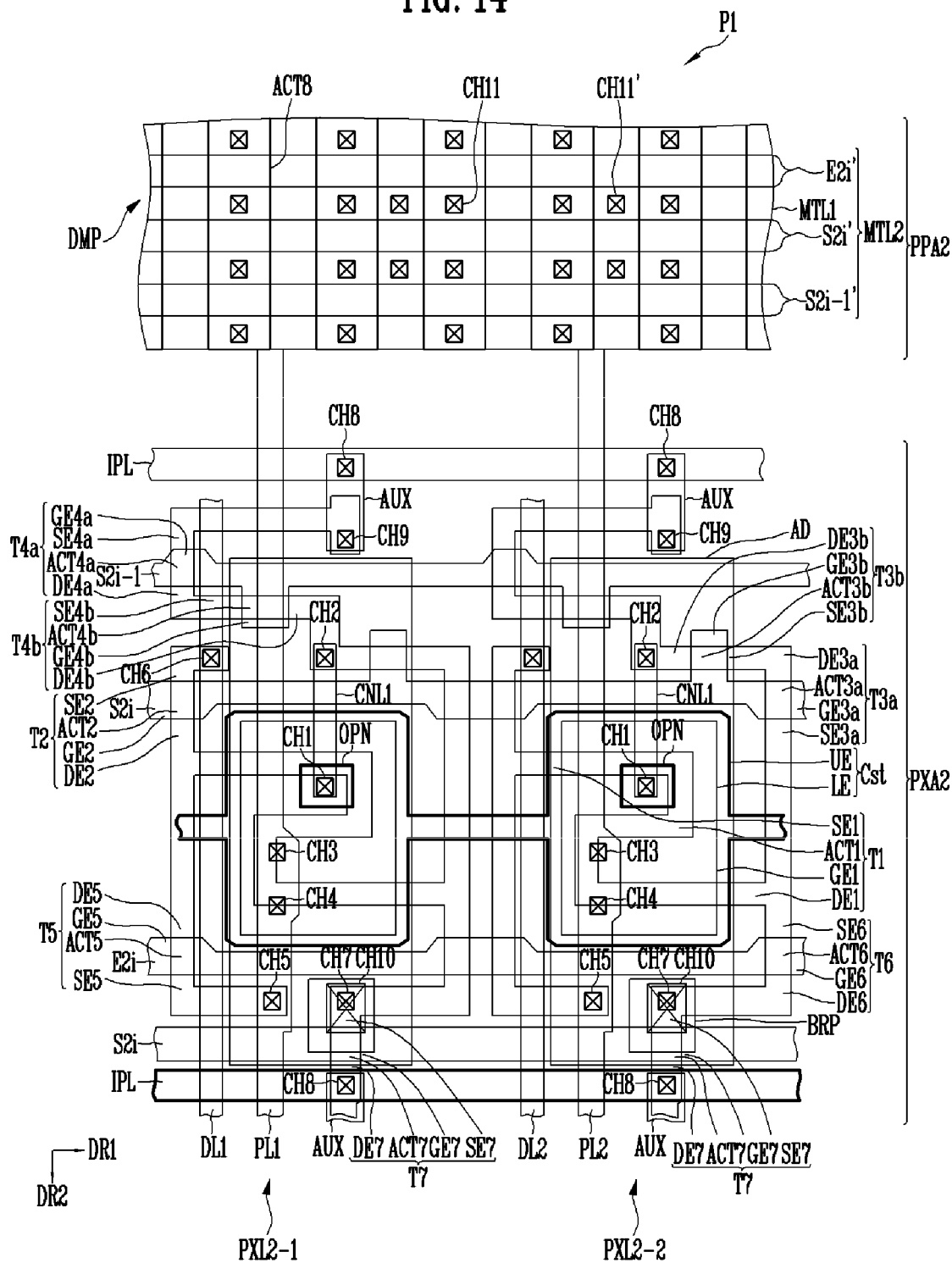
FIG. 14 is a plan view illustrating a portion corresponding to P1 of FIG. 1 for illustrating portions of a dummy part according to another embodiment and a portion of a second pixel area adjacent to the dummy part.

FIG. 14 illustrates a view illustrating portions of a dummy part and a second pixel area adjacent to the dummy part, according to another embodiment. FIG. 14 is a plan view illustrating a portion P1 of FIG. 1. To avoid redundancy, differences from the earlier described embodiments are mainly described with reference to FIG. 14. Portions that are not particularly described may comply with the earlier described embodiments. Like or identical reference numerals refer to like or identical parts and components.

Referring to FIGS. 1 and 14, a display device may include the substrate SUB, the line part, and the second pixels PXL2-1 and PXL2-2.

The substrate SUB may include the second pixel area PXA2 where the second pixels PXL2-1 and PXL2-2 are provided and the second peripheral area PPA2 surrounding the second pixel area PXA2. The dummy part DMP may be provided in the second peripheral area PPA2 so as to compensate for the difference in a load value between the pixel areas PXA.

The second pixels PXL2-1 and PXL2-2 may be disposed closest to the dummy part DMP in the second direction DR2 in the second pixel area PXA2. Each of the second pixels PXL2-1 and PXL2-2 may include the organic light emitting device, the first to seventh transistors T1 to T7, and the storage capacitor Cst.

The line part may include the second scan lines S2$i$-1 and S2$i$, the first and second data lines DL1 and DL2, the emission control line E2$i$, the power supply lines PL1 and PL2, and the initialization power supply line IPL that supply signals to each of the second pixels PXL2-1 and PXL2-2.

The second scan lines S2$i$-1 and S2$i$ may extend in the first direction DR1. The second scan lines S2$i$-1 and S2$i$ may include the (i−1)th second scan line S2$i$-1 and the i-th second scan line S2$i$ that are sequentially arranged in the second direction DR2 that crosses the first direction DR1.

The emission control line E2$i$ may extend in the first direction DR1 and receive an emission control signal.

Hereinafter, the second scan lines S2$i$-1 and S2$i$ and the emission control line E2$i$ may extend to the second peripheral area PPA2 and/or the additional peripheral area APA. More specifically, the second scan lines S2$i$-1 and S2$i$ provided in the second pixel area PXA2 may extend to the second peripheral area PPA2 surrounding the second pixel area PXA2. In addition, the emission control line E2$i$ provided in the second pixel area PXA2 may extend to the second peripheral area PPA2.

The second scan lines S2$i$-1 and S2$i$ extending from the second pixel area PXA2 to the second peripheral area PPA2 may be the "second scan line extension portions S2$i$-1' and S2$i$'" and the emission control line E2$i$ extending from the second pixel area PXA2 to the second peripheral area PPA2 may be the "emission control line extension portion E2$i$'".

The dummy part DMP may include the eighth active pattern ACT8, the second metal layer MTL2, and the first metal layer MTL1.

The eighth active pattern ACT8 may be provided on the same layer as the first to seventh active patterns ACT1 to ACT7 that are provided in the second pixels PXL2-1 and PXL2-2. The eighth active pattern ACT8 may be formed of a semiconductor layer, and the semiconductor layer may or may not be doped with impurities.

The second metal layer MTL2 may include the second scan line extension portions S2$i$-1' and S2$i$' and the emission control line extension portion E2$i$' and be provided on the same layer as the second scan lines S2$i$-1 and S2$i$ and the emission control line E2$i$ that are provided in the second pixel area PXA2.

The first metal layer MTL1 may overlap with the eighth active pattern ACT8 and the second metal layer MTL2 with the insulating layers GI, IL1, and IL2 interposed therebetween and cover a portion or entirety of the second peripheral area PPA2. The first metal layer MTL1 may extend from the power supply lines PL1 and PL2 connected to the second pixels PXL2-1 and PXL2-2 that are disposed closest to the dummy part DMP. The first metal layer MTL1 may be provided on the same layer as the first and second data lines DL1 and DL2 and the power supply lines PL1 and PL2. According to one embodiment, the first metal layer MTL1 may be formed integrally with the power supply lines PL1 and PL2, so that a fixed voltage provided from the power supply lines PL1 and PL2 may also be applied to the first metal layer MTL1. The first metal layer MTL1 may overlap with the second metal layer MTL2 to form a parasitic capacitor. In addition, the second metal layer MTL2 may overlap with the eighth active pattern ACT8 while interposing the gate insulating layer GI, among the insulating layers GI, IL1, and IL2, to form the parasitic capacitor.

The first metal layer MTL1 may be connected to the eighth active pattern ACT8 through the eleventh contact hole CH11. The eleventh contact hole CH11 may be disposed in an area where the second metal layer MTL2 is not provided, and the eighth active pattern ACT8 and the first metal layer MTL1 overlap with each other.

The dummy part DMP may include at least one eleventh contact hole CH11. However, the present disclosure is not limited thereto. For example, the dummy part DMP may include the same or less number of eleventh contact holes CH11 as the number of contact holes CH1 to CH10 that are provided in the second pixels PXL2-1 and PXL2-2. By arranging the eleventh contact hole CH11 in the dummy part DMP, the elements disposed in the second pixels PXL2-1 and PXL2-2 that are disposed closest to the dummy part DMP, for example, lines, active patterns, and contact holes, may have a similar density to the elements disposed in the dummy part DMP.

In addition, the dummy part DMP may further include at least one dummy contact hole CH11'. The dummy contact hole CH11' may be provided on one of the insulating layers GI, ILL and IL2 and between the eleventh contact holes CH11 as viewed in the plane. The dummy contact hole CH11' may be added to make the density of the elements disposed in the dummy part DMP, together with the eleventh contact hole CH11, similar to the density of the elements disposed in the second pixels PXL2-1 and PXL2-2.

Figure 15:
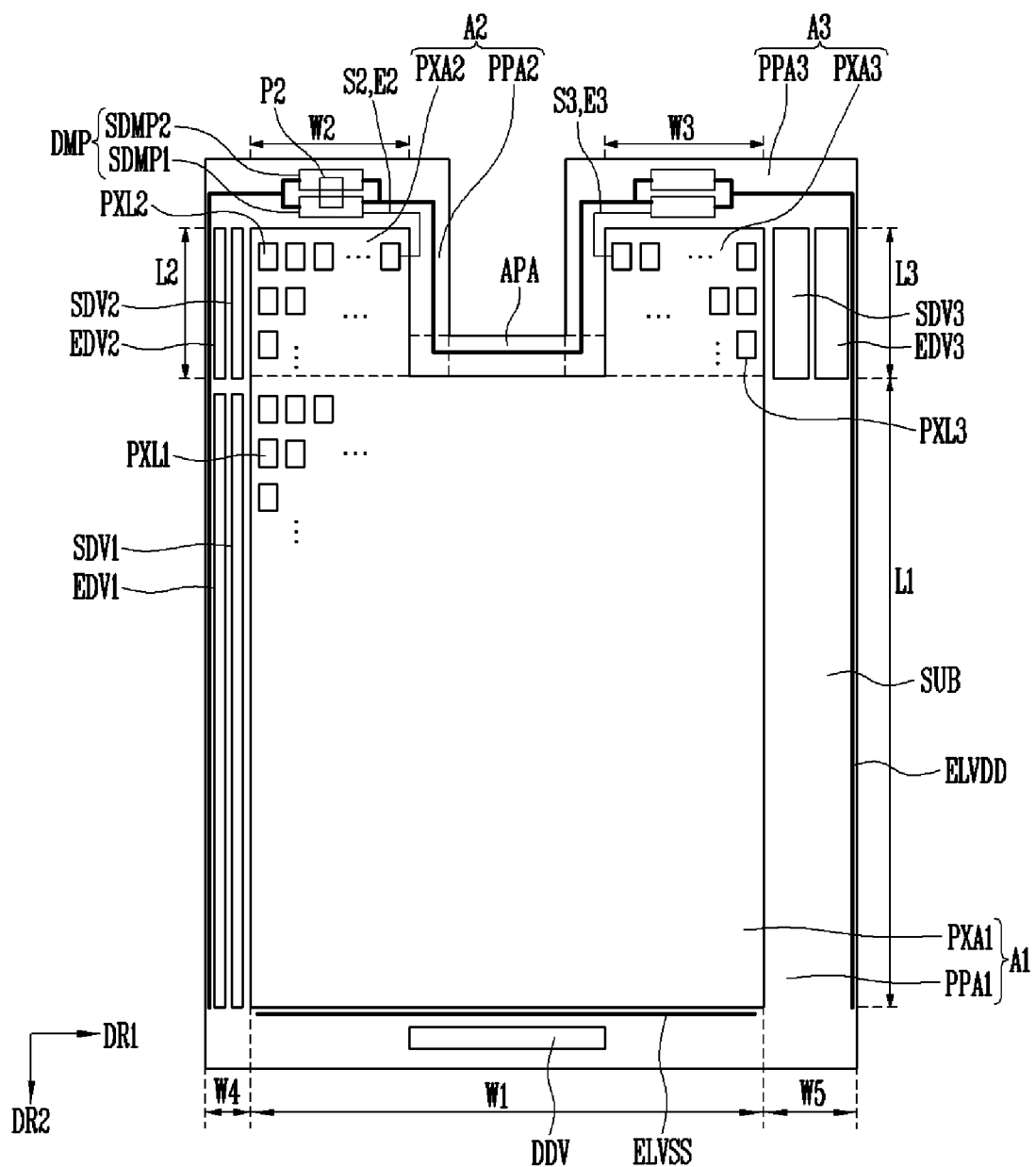
FIGS. 15 and 16 are plan views illustrating a display device, according to another embodiment.
Figure 16:
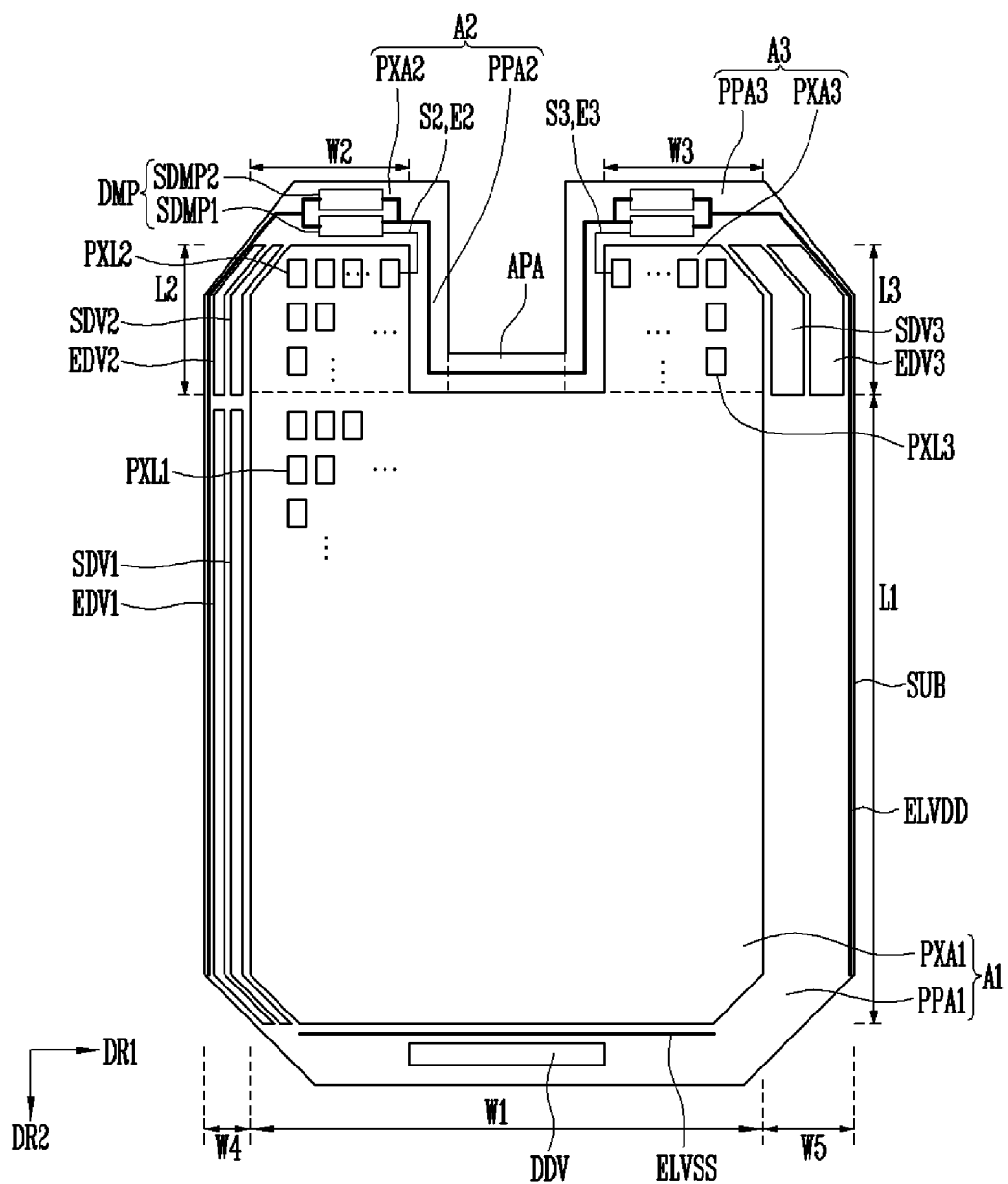

FIGS. 15 and 16 are plan views illustrating a display device, according to another embodiment. To avoid redundancy, differences from the earlier described embodiments are mainly described with reference to FIGS. 15 and 16. Portions that are not particularly described in this embodiment may comply with the display device according to the earlier described embodiment. Like or identical reference numerals refer to like or identical components or parts. In addition, for convenience of explanation, FIGS. 15 and 16 illustrate only the second and third scan lines S2 and S3 and the second and third emission control lines E2 and E3 from the line part.

Referring to FIGS. 15 and 16, the display device may include the substrate SUB, the pixels (PXL1, PXL2, and PXL3; hereinafter, 'PXL') provided on the substrate SUB, the driver provided on the substrate SUB to drive the pixels PXL, the first and second power supply lines ELVDD and ELVSS applying power to the pixels, and the line part connecting the pixels PXL and the driver to each other.

The substrate SUB may include a plurality of areas, at least two of which may have different sizes from each other. The substrate SUB may include the first, second, and third areas A1, A2, and A3.

Referring to FIG. 15, each of the first, second, and third areas A1, A2, and A3 may have a substantially rectangular shape. Referring to FIG. 16, a width of at least a corner portion of the first, second, and third areas A1, A2, and A3 may decrease away from the boundaries between the second and third areas A2 and A3 and the first area A1.

The first, second, and third areas A1, A2, and A3 may include the pixel areas PXA1, PXA2, and PXA3 (hereinafter, 'PXA') and the peripheral areas PPA1, PPA2, and PPA3 (hereinafter, 'PPA'). More specifically, the first area A1 may include the first pixel area PXA1 where the first pixel PXL1 is provided and the first peripheral area PPA1 surrounding the first pixel area PXA1. The second area A2 may include the second pixel area PXA2 where the second pixel PXL2 is provided and the second peripheral area PPA2 surrounding the second pixel area PXA2. The third area A3 may include the third pixel area PXA3 where the third pixel PXL3 is provided and the third peripheral area PPA3 surrounding the third pixel area PXA3.

The driver may include the scan drivers SDV1, SDV2, and SDV3 (hereinafter, "SDV") supplying scan signals to the respective pixels PXL along the scan lines, the emission drivers EDV1, EDV2, and EDV3 (hereinafter, "EDV") supplying emission control signals to the respective pixels PXL along the emission control lines, the data driver DDV supplying data signals to the respective pixels PXL along the data lines, and the timing controller (not illustrated). The timing controller may control the scan driver SDV, the emission driver EDV, and the data driver DDV.

A voltage applied to the first power supply line ELVDD may be higher than a voltage applied to the second power supply line ELVSS.

According to one embodiment, a parasitic capacitance of the dummy part DMP disposed in the peripheral area PPA corresponding to each pixel area PXA may be used to compensate for the difference in a load value according to each pixel area PXA, more specifically, to compensate for the difference in a load value of the scan lines between the first pixel area PXA1, the second pixel area PXA2, and the third pixel area PXA3. The dummy part DMP may not be provided in the first peripheral area PPA1, but may be provided in the second peripheral area PPA2 and the third peripheral area PPA3.

The dummy part DMP may include a first sub-dummy part SDMP1 and a second sub-dummy part SDMP2. The first sub-dummy part SDMP1 and the second sub-dummy part SDMP2 may be separated from each other in a distance and connected to each other by separate connection lines.

Figure 17:
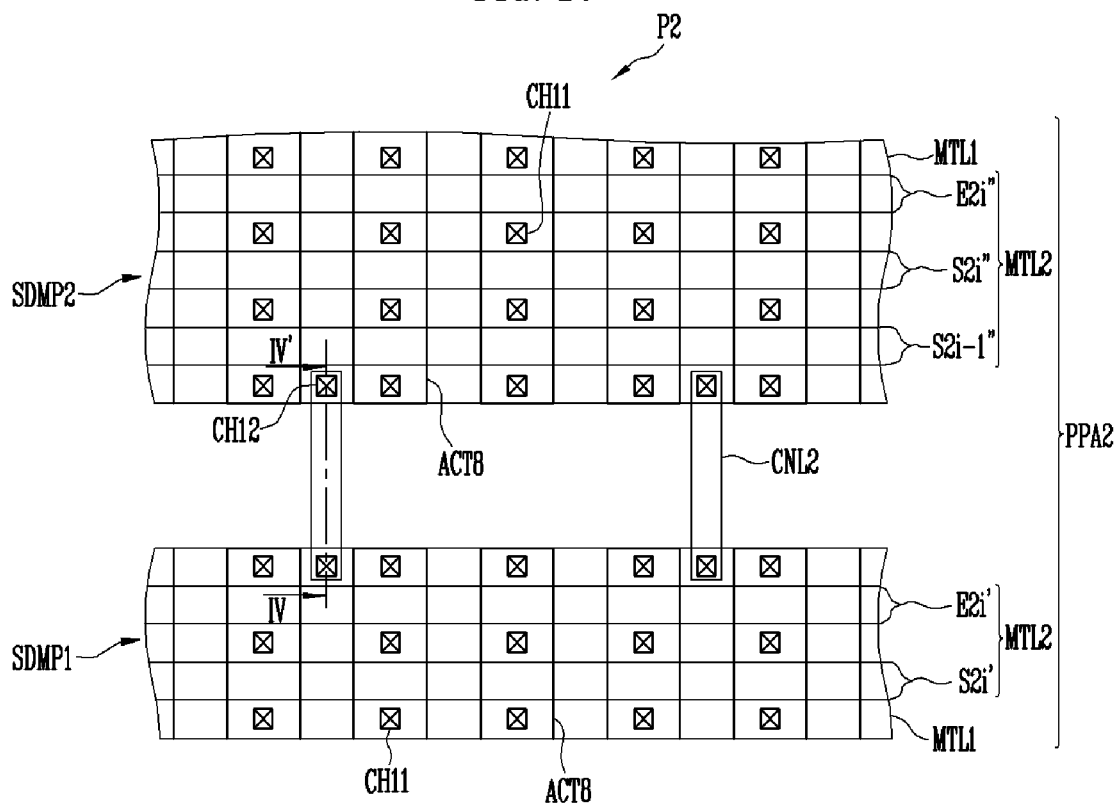
FIG. 17 is a plan view illustrating a portion corresponding to P2 of FIG. 15.
Figure 18:
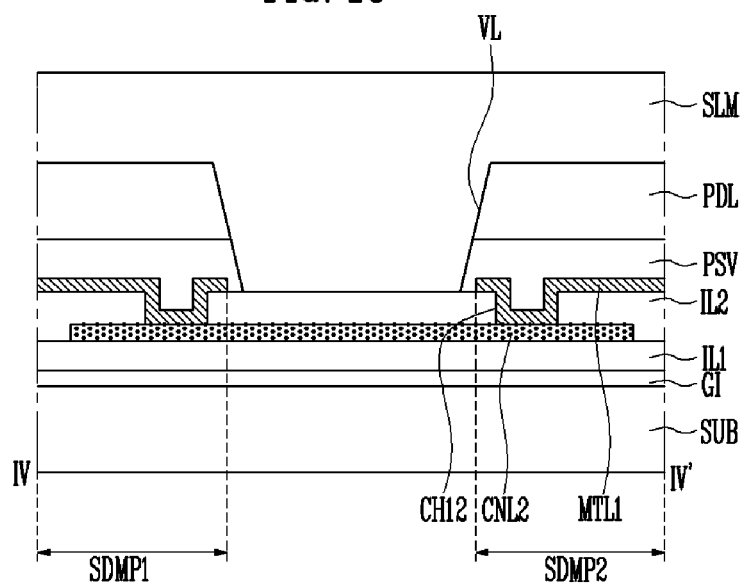
FIG. 18 is a cross-sectional view taken along line IV-IV' of FIG. 17.

FIG. 17 is a plan view illustrating a portion corresponding to P2 of FIG. 15, and FIG. 18 is a cross-sectional view taken along line IV-IV'.

Referring to FIGS. 15, 17, and 18, the display device may include the dummy part DMP that is disposed in the second peripheral area PPA2 of the substrate SUB. The dummy part DMP may include the first sub-dummy part SDMP1 and the second sub-dummy part SDMP2.

Each of the first sub-dummy part SDMP1 and the second sub-dummy part SDMP2 may include the eighth active pattern ACT8 that is provided on the substrate SUB and the first metal layer MTL1 that is provided on the eighth active pattern ACT8 with the insulating layers GI, IL1, and IL2 interposed therebetween.

The eighth active pattern ACT8 of each of the first and second sub-dummy parts SDMP1 and SDMP2 may be provided on the same layer as the active pattern of the transistor provided in the second pixel PXL2 in the second pixel area PXA2. The eighth active pattern ACT8 may include a semiconductor layer doped with impurities. As viewed in the plane, the eighth active pattern ACT8 may partially overlap with the second metal layer MTL2.

The second metal layer MTL2 of the first sub-dummy part SDMP1 may include the second scan line extension portion S2i' extending from the second pixel area PXA2 to the second peripheral area PPA2. In addition, the second metal layer MTL2 of the first sub-dummy part SDMP1 may include the emission control line extension portion E2i' extending from the second pixel area PXA2 to the second peripheral area PPA2. The second metal layer MTL2 of the first sub-dummy part SDMP1 may be provided on the same layer as the second scan lines S2i and S2i−1 and the second emission control line E2 that are provided on the second pixel area PXA2.

The second metal layer MTL2 of the second sub-dummy part SDMP2 may include the second scan line extension portions S2i−1" and S2i" extending from the second pixel area PXA2 to the second peripheral area PPA2. In addition, the second metal layer MTL2 of the second sub-dummy part SDMP2 may include the emission control line extension portion E2i" extending from the second pixel area PXA2 to the second peripheral area PPA2. The second metal layer MTL2 of the second sub-dummy part SDMP2 may be provided on the same layer as the second scan lines S2i and S2i−1 and the second emission control line E2.

The first metal layer MTL1 of each of the first and second sub-dummy parts SDMP1 and SDMP2 may overlap with the eighth active pattern ACT8 as viewed in the plane and cover a portion of the second peripheral area PPA2. The data line of the first metal layer MTL1 may be provided on the same layer as the first power supply line ELVDD.

The first metal layer MTL1 may be connected to the eighth active pattern ACT8 through the eleventh contact hole CH11. The eleventh contact hole CH11 may be disposed in an overlapping area between the eighth active pattern ACT8 and the first metal layer MTL1. More specifically, the eleventh contact hole CH11 may be provided in an area where the second metal layer MTL2 is not provided, and the eighth active pattern ACT8 and the first metal layer MTL1 overlap with each other.

The first sub-dummy part SDMP1 and the second sub-dummy part SDMP2 may be separated from each other by a distance in the second peripheral area PPA2. The first sub-dummy part SDMP1 and the second sub-dummy part SDMP2 may be connected to each other by the second connection lines CNL2.

The second connection lines CNL2 may have a bar shape extending in a length direction as viewed in the plane. However, the present disclosure is not limited thereto. In addition, as viewed in the plane, one end of the second connection lines CNL2 may overlap with one side of the first sub-dummy part SDMP1 and the other end facing one of the second connection lines CNL2 may overlap with one side of the second sub-dummy part SDMP2. The second connection lines CNL2 may be connected to one side of the first sub-dummy part SDMP1 and one side of the second sub-dummy part SDMP2 through a twelfth contact hole CH12 passing through the second interlayer insulating layer IL2, among the insulating layers GI, IL1, and IL2. As a result, the first sub-dummy part SDMP1 and the second sub-dummy part SDMP2 may be connected to each other by the second connection lines CNL2.

The structure of the second sub-dummy part SDMP2 and the second connection lines CNL2 is described below according to a stacking structure with reference to FIG. 17.

The gate insulating layer GI and the first interlayer insulating layer IL1 may be sequentially formed on the substrate SUB. The second connection lines CNL2 may be formed on the first interlayer insulating layer ILL The second connection lines CNL2 may be provided on the same layer as the upper electrode UE of the storage capacitor that is provided in the second pixel PXL2 as shown in FIG. 8.

The second interlayer insulating layer IL2 may be formed on the second connection lines CNL2. The twelfth contact hole CH12 may be formed through the second interlayer insulating layer IL2 to expose a portion of the second connection lines CNL2.

The first metal layer MTL1 may be provided on the second interlayer insulating layer IL2 including the twelfth contact hole CH12.

The passivation layer PSV and the pixel defining layer PDL may be sequentially formed on the substrate SUB where the first metal layer MTL1 is formed. Each of the passivation layer PSV and the pixel defining layer PDL may be an organic insulating layer including an organic material. As the organic material, polyacrylic compounds, polyimide compounds, fluorocarbon compounds such as Teflon, and benzocyclobutene compounds may be used.

The sealing layer SLM covering the pixel defining layer PDL may be provided on the pixel defining layer PDL. The sealing layer SLM may cover the pixel area PXA of the substrate SUB and extend outward beyond the pixel area PXA. The sealing layer SLM may be an inorganic insulating layer including an inorganic material.

The insulating layers PSV and PDL including the organic material may be advantageous in terms of flexibility and elasticity but may be more subject to ingress of moisture or oxygen as compared with insulating layers including an inorganic material. According to one embodiment, end portions of the insulating layers PSV and PDL including the organic material may be covered by the insulating layers including the inorganic material. For example, the passivation layer PSV and the pixel defining layer PDL including the organic material may extend to a portion of the peripheral area PPA of the substrate SUB but may not cover the entire peripheral area PPA. The passivation layer PSV and the pixel defining layer PDL may have a valley VL formed by removing a portion thereof along the circumference of the pixel area PXA. According to one embodiment, the top surface of the pixel defining layer PDL and the second interlayer insulating layer IL2 that are exposed by the valley VL may be sealed by the sealing layer SLM including the inorganic material to prevent ingress of moisture or oxygen.

According to one embodiment, the second connection lines CNL2 may be disposed in the second peripheral area PPA2 of the substrate SUB so as to overlap with the valley VL. In other words, the second connection lines CNL2 may correspond to the valley VL.

A display device according to one embodiment may be used in various electronic devices. For example, the display device may be applicable to televisions, notebooks, smartphones, smartpads, portable media players (PMPs), person digital assistances (PDAs), navigations, or various types of wearable devices, such as smartwatches.

The above-described display device may have at least two areas having different sizes from each other, and each of the areas may have uniform brightness.

Although example embodiments are disclosed herein, these embodiments should not be construed to limit a scope of the present disclosure. Those of ordinary skill in the art would recognize that various changes in form and details may be made without departing from the spirit and scope of the present disclosure.

What is claimed is:

1. A display device comprising:
    a substrate including a first area, a second area extended from a first portion of the first area, a third area separated from the second area and extended from a second portion of the first area, and a peripheral area surrounding the first area, the second area, and the third area; and
    a plurality of pixels provided in each of the first area, the second area, and the third area,
    wherein at least a corner portion of each of the first area, the second area, and the third area has a width decreasing away from a boundary between one of the second area and the third area, and the first area.

2. The display device of claim 1, wherein:
    each of the second area and the third area has a smaller area than the first area, and
    an outer corner portion of each of the second area and the third area has an oblique corner.

3. The display device of claim 2, further comprising:
    a first line connected to the plurality of pixels provided in the first area;
    a second line connected to the plurality of pixels provided in the second area; and
    a third line connected to the plurality of pixels provided in the third area.

4. The display device of claim 3, further comprising:
    a dummy part disposed in the peripheral area; and
    a power line overlapping and extending through the first area, the second area, and the third area and connected to the dummy part.

5. The display device of claim 4, wherein the dummy part overlaps at least one of the second line and the third line and forms a parasitic capacitance that compensates for a difference in a load value among the first line, the second line, and the third line.

6. The display device of claim 5, wherein the dummy part includes:
    an active pattern disposed on the substrate;
    an insulating layer disposed on the active pattern and including a contact hole;
    a first metal layer disposed on the insulating layer; and
    a second metal layer disposed between the active pattern and the first metal layer,
    wherein the active pattern and the first metal layer are connected through the contact hole.

7. The display device of claim 6, wherein:
    the contact hole is provided in an overlapping area between the active pattern and the first metal layer, and
    the first metal layer is connected to a power supply line.

8. The display device of claim 6, wherein the first metal layer extends from the power line connected to pixels closest to the dummy part among the plurality of pixels to the peripheral area.

9. The display device of claim 7, wherein:
    the first line is a first scan line extending in a first direction on substrate and supplying a first scan signal to the plurality of pixels provided in the first area, the second line is a second scan line extending in the first direction and supplying a second scan signal to the plurality of pixels provided in the second area, and the third line is a third scan line extending in the first direction and supplying a third scan signal to the plurality of pixels provided in the third area, wherein the second metal layer is provided in a same layer as the first scan line, the second scan line, and the third scan line.

10. The display device of claim 9, wherein a first length of the first scan line is greater than each of a second length of the second scan line and a third length of the third scan line.

11. The display device of claim 10, wherein at least one of the second scan line and the third scan line extends to a portion of the peripheral area and overlaps the dummy part.

12. The display device of claim 11, wherein:
the dummy part includes at least two sub-dummy parts separated from each other by a distance, and
the at least two sub-dummy parts are connected to each other by a coupling pattern.

13. The display device of claim 12, wherein:
the coupling pattern is provided between the second metal layer and the first metal layer, and
the coupling pattern extends from one of the two sub-dummy parts to the other sub-dummy part in a plan view.

14. The display device of claim 13, further comprising:
a passivation layer disposed on the first metal layer;
a pixel defining layer disposed on the passivation layer; and
a sealing layer covering portions of the first area, the second area, the third area, and a portion of the peripheral area and including an inorganic material,
wherein the passivation layer and the pixel defining layer have a valley formed by removing portions of the passivation layer and the pixel defining layer along a circumference of each of the first area, the second area, and the third area.

15. The display device of claim 14, wherein:
the valley is formed at a position corresponding to the coupling pattern, and
the sealing layer covers side surfaces of the passivation layer and the pixel defining layer.

16. The display device of claim 6, wherein the insulating layer of the dummy part further comprises a dummy contact hole that is different from the contact hole.

17. The display device of claim 16, wherein a first density of elements disposed in the dummy part is similar to a second density of elements disposed in a pixel that is disposed closest to the dummy part in at least one of the second area and the third area.

* * * * *